(12) United States Patent
Song et al.

(10) Patent No.: US 7,755,080 B2
(45) Date of Patent: Jul. 13, 2010

(54) METHOD FOR FORMING QUANTUM DOT, AND QUANTUM SEMICONDUCTOR DEVICE AND METHOD FOR FABRICATING THE SAME

(75) Inventors: Hai-Zhi Song, Kawasaki (JP); Toshio Ohshima, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/976,967

(22) Filed: Oct. 30, 2007

(65) Prior Publication Data
US 2008/0067498 A1    Mar. 20, 2008

Related U.S. Application Data

(60) Division of application No. 10/991,971, filed on Nov. 19, 2004, now Pat. No. 7,307,030, which is a continuation of application No. PCT/JP03/06250, filed on May 20, 2003.

(30) Foreign Application Priority Data

May 22, 2002  (JP)  ............................. 2002-147287
Feb. 12, 2003  (JP)  ............................. 2003-034245

(51) Int. Cl.
    *H01L 29/06*    (2006.01)
(52) U.S. Cl. ............................. 257/22; 257/17; 257/18; 257/E21.404; 257/E29.071
(58) Field of Classification Search .............. 257/22
    See application file for complete search history.

(56) References Cited

U.S. PATENT DOCUMENTS 5,229,320 A    7/1993   Ugajin (Continued)

FOREIGN PATENT DOCUMENTS

EP             0 703 626 A2    3/1996

(Continued)

OTHER PUBLICATIONS

Won-chul Moon et al., "Fabrication of Nanopit Arrays on Si(111)", Japanese Journal of Applied Physics, vol. 38, Part 1, No. 1B, pp. 483-486, Jan. 1999.

(Continued)

*Primary Examiner*—Jerome Jackson, Jr.
(74) *Attorney, Agent, or Firm*—Westerman, Hattori, Daniels & Adrian, LLP

(57) ABSTRACT

The method for forming a quantum dot according to the present invention comprises the step of forming an oxide in a dot-shape on the surface of a semiconductor substrate 10, the step of removing the oxide to form a concavity 16 in the position from which the oxide has been removed, and the step of growing a semiconductor layer 18 on the semiconductor substrate with the concavity formed in to form a quantum dot 20 of the semiconductor layer in the concavity. The concavity is formed in the semiconductor substrate by forming the oxide dot in the surface of the semiconductor substrate and removing the oxide, whereby the concavity can be formed precisely in a prescribed position and in a prescribed size. The quantum dot is grown in such a concavity, whereby the quantum dot can have good quality and can be formed in a prescribed position and in a prescribed size.

15 Claims, 28 Drawing Sheets

U.S. PATENT DOCUMENTS

| | | | |
|---|---|---|---|
| 5,529,952 A | 6/1996 | Smith et al. | |
| 5,608,229 A | 3/1997 | Mukai et al. | |
| 5,629,231 A | 5/1997 | Kiehl | |
| 5,710,436 A | 1/1998 | Tanamoto et al. | |
| 5,905,273 A * | 5/1999 | Hase et al. | 257/24 |
| 6,033,972 A | 3/2000 | Ro et al. | |
| 6,090,666 A | 7/2000 | Ueda et al. | |
| 6,242,326 B1 | 6/2001 | Ro et al. | |
| 6,326,311 B1 | 12/2001 | Ueda et al. | |
| 6,383,286 B1 | 5/2002 | Koguchi et al. | |
| 6,573,527 B1 * | 6/2003 | Sugiyama et al. | 257/14 |
| 2002/0167002 A1 * | 11/2002 | Chae et al. | 257/20 |
| 2005/0042386 A1 | 2/2005 | Nunoshita et al. | |

FOREIGN PATENT DOCUMENTS

| | | |
|---|---|---|
| EP | 0851506 A2 | 7/1998 |
| EP | 0 903 778 A1 | 3/1999 |
| EP | 1 054 249 A1 | 11/2000 |
| JP | 4-245620 A | 9/1992 |
| JP | 7-94806 A | 4/1995 |
| JP | 7-254730 A | 10/1995 |
| JP | 7-297381 A | 11/1995 |
| JP | 9-171963 A | 6/1997 |
| JP | 9-326506 A | 12/1997 |
| JP | 10-92746 A | 4/1998 |
| JP | 10-173181 A | 6/1998 |
| JP | 10-177998 A | 6/1998 |
| JP | 11-112099 A | 4/1999 |
| JP | 11-340449 A | 12/1999 |
| JP | 2000-150862 A | 5/2000 |
| JP | 2000-249712 A | 9/2000 |
| JP | 2000-315654 A | 11/2000 |
| JP | 2001-7315 A | 1/2001 |

OTHER PUBLICATIONS

Shigeru Kohmoto et al., Applied Physical Letters, vol. 75, No. 22, Nov. 29, 1999, pp. 3488-3490.

C.K. Hyon et al., Applied Physical Letters, vol. 77, No. 16, Oct. 16, 2000, pp. 2607-2609.

Tomonori Ishikawa et al., Applied Physical Letters, vol. 76, No. 2, Jan. 10, 2000, pp. 167-169.

S. Nishikawa et al., Physical Stat. Sol. (b) 224, No. 2, pp. 521-525 (2001).

Toshio Ohshima, Physical Review A, Volume, 62, Nov. 15, 2000, pp. 062316-1-062316-6.

Supplementary European Search Report issued on Sep. 16, 2008 for corresponding European Patent Application No. 03752919.5.

Shuichi Miyakawa et al., "Single Electron Transistor s Fabricated with AFM Ultrafine Nanooxidation Process," Electronics and Communication in Japan, Part 2, vol. 81, No. 10, Oct. 1, 1998, pp. 12-18.

Osako, Shin-icbi et al.; "Quantum anti-dot array and quantum wire transistors fabricated on InAs/Al0.5Ga0.5Sb heterostructures"; Semicond. Sci. Technol., vol. 11, 1996, pp. 571-575.

Moon, Won-chul et al.; "Fabrication of Nanopit Arrays on Si(111)"; Jpn. J. Appl. Phys., vol. 38, 1999, pp. 483-486.

European Search Report dated Aug. 6, 2009, issued in corresponding European Patent Application No. 09161296.0.

* cited by examiner ically low, it will be possible to form an electrode above a single quantum dot by using such process. That is, electrodes are formed suitably above the regions where quantum dots are expected to have been formed, by using a process which can make submicron processing. Then, whether or not the quantum dots are present below the electrodes is checked. The electrode formation and the following check are repeated many times, whereby the presence of a single quantum dot below the electrode could be often found. However, it is almost impossible to capture a single quantum dot in a case that the density of the quantum dots is high. Such method depending on the probability is inefficient to fabricate devices.

METHOD FOR FORMING QUANTUM DOT, AND QUANTUM SEMICONDUCTOR DEVICE AND METHOD FOR FABRICATING THE SAME

CROSS REFERENCE TO RELATED APPLICATIONS

This application is a division of U.S. application Ser. No. 10/991,971, filed Nov. 19, 2004, which is a Continuation of International Application No. PCT/JP03/06250, with an international filing date of May 20, 2003, which designated the United States.

TECHNICAL FIELD

The present invention relates to a method for forming a quantum dot which can form a quantum dot in a prescribed position and in a prescribed size, and a quantum semiconductor device comprising a quantum dot and a method for fabricating the quantum semiconductor device.

BACKGROUND ART

Conventionally, as a method for forming quantum dots, the forming method based on Stranski-Krastanow mode (S-K mode) is known.

S-K mode is a mode in which a semiconductor crystal to be epitaxially grown grows two-dimensionally (film growth) at the start of the growth and grows three-dimensionally on the stage where the semiconductor crystal has exceeded the elastic limit of the film. A film having a larger lattice constant than the base material is epitaxially grown, whereby quantum dots of three-dimensionally grown islands are self-assembled.

S-K mode can easily make quantum dots self-assembled, and is widely used in the field of photosemiconductor devices, etc.

Recently, techniques in the fields of quantum information and quantum computation attract a great deal of attention. In these fields it is very important to form a quantum dot in a prescribed position in a prescribed size.

However, the conventional method for forming quantum dots described above makes positions and sizes of the formed quantum dots random.

As techniques of controlling positions for quantum dots to be formed in, the following techniques have been proposed.

For example, Japanese published unexamined patent application No. 2000-315654, the specification of U.S. Pat. No. 5,229,320 and Appl. Phys. Lett., Vol. 76, No. 2, p. 167-169, (2000) propose techniques of controlling positions for quantum dots to be formed in by forming in advance by means of electron beams concavities in the surface of a semiconductor substrate in positions for quantum dots to be formed in. When a semiconductor layer is grown on a semiconductor substrate with concavities formed in, the semiconductor layer tends to grow at a higher rate in the concavities, whereby quantum dots can be formed in the concavities.

Appl. Phys. Lett., Vol. 75, No. 22, p. 3488-3490, (1999) and Phys. Stat. Sol. (b) 224, No. 2, p. 521-525, (2001) propose a technique of forming in advance by means of an STM (Scanning Tunneling Microscope) deposits in positions for quantum dots to be formed in to thereby control the positions for the quantum dots to be formed in. When a semiconductor layer is grown on a substrate with deposits formed on, concavities are formed in the semiconductor layer surface above the deposits. When another semiconductor layer is grown on the semiconductor layer with the concavities formed in, quantum dots are formed in the concavities because said another semiconductor layer grows in the concavities at a faster growth rate.

Appl. Phys. Lett., Vol. 77, No. 16, p. 2607-2609, (2000) proposes a technique of forming trenches in the surface of a semiconductor substrate by means of an AFM (Atomic Force Microscope) to form quantum dots in the trenches.

However, in the above-described technique of forming the concavities by means of electron beams, the surface of the semiconductor substrate is contaminated with carbon when the concavities are formed by means of electron beams, which makes it difficult to form quantum dots of good quality.

In the above-described technique of controlling positions of quantum dots by using an STM, crystal defects take place in the semiconductor layer with the concavities formed in. It is difficult to form quantum dots of good quality on the semiconductor layer having the crystal defects. Furthermore, the diameter of the concavities are somewhat enlarged, and it is difficult to form fine quantum dots of a below 40 nm (including 40 nm)-diameter.

In the technique of controlling positions of quantum dots by using an AFM, the trenches are formed in the substrate surface by mechanically scraping the substrate surface with the probe of the AFM. Therefore, the configurations of the trenches are non-uniform. It is difficult to form quantum dots in a uniform size. The trenches are formed by mechanically scraping the substrate surface, which causes crystal defects in the trenches. It is difficult to form quantum dots of good quality without crystal defects in the trenches with such crystal defects.

Recently techniques in the fields of quantum information and quantum computation attract a great deal of attention as described above, and possibilities of applications of quantum dots attract attention. However, for further fundamental studies and application development of quantum dots, various technical barriers which have to be overcome are present.

For example, quantum dots have small sizes, and the quantum dots self-assembled by using S-K mode are distributed at random. No method that makes the self-assembled quantum dots distributed at random electrically accessible has been so far proposed.

On the other hand, conductor pads of an about 100 nm-size can be formed by using processes, such as electron beam lithography, reactive ion etching, etc., which can make submicron processing. Accordingly, in a case that the density of quantum dots is very low, it will be possible to form an electrode above a single quantum dot by using such process. That is, electrodes are formed suitably above the regions where quantum dots are expected to have been formed, by using a process which can make submicron processing. Then, whether or not the quantum dots are present below the electrodes is checked. The electrode formation and the following check are repeated many times, whereby the presence of a single quantum dot below the electrode could be often found. However, it is almost impossible to capture a single quantum dot in a case that the density of the quantum dots is high. Such method depending on the probability is inefficient to fabricate devices.

Japanese published unexamined patent application No. Hei 07-297381 (1995) proposes a method of electrically accessing quantum dots by means of electrodes in the form of a fine probe shape. However, in this case, in order to arrange electrodes above quantum dots, a special process for forming the quantum dots in an array or others is necessary. In Patent Reference 1, electric fields of the probe-shaped electrodes will be distributed far more widely than a size of the quantum dots. Accordingly, the electric fields of the electrode arranged above a certain quantum dot will influence quantum dots adjacent to said certain quantum dot.

As described above, the conventional techniques have established no method of making accurate electric access to each of quantum dots which have self-assembled at random.

It is very significant in various aspects of the fundamental studies, application developments, etc. of quantum dots to realize the accurate electric access to each of self-assembled quantum dots.

An object of the present invention is to provide a method for forming a quantum dot which can form a quantum dot of good-quality in a prescribed position and in a prescribed size.

Another object of the present invention is to provide a quantum semiconductor device which can make accurate electric access to a quantum dot and a method for fabricating the quantum semiconductor device.

DISCLOSURE OF INVENTION

The above-described object is achieved by a method for forming a quantum dot comprising the steps of: forming an oxide in a dot-shape on a surface of a semiconductor substrate; removing the oxide to form a concavity in a position where the oxide has been removed; and growing a semiconductor layer on the semiconductor substrate with the concavity formed in to form a quantum dot of the semiconductor layer in the concavity.

The above-described object is also achieved by a quantum semiconductor device comprising: a quantum dot formed on a semiconductor substrate; a semiconductor layer formed, burying the quantum dot; and an electrode formed by self-alignment above a position where strains are generated in the semiconductor layer because of the quantum dot. Accordingly, the quantum dots can be accurately electrically accessible via such electrodes, and the quantum dots can be electrically accessible independently of each other.

The above-described object is also achieved by a quantum semiconductor device comprising: a quantum dot formed on a semiconductor substrate; a semiconductor layer formed, burying the quantum dot; and an electrode formed in a concavity formed in a surface of the semiconductor layer in a position above the quantum dot. Accordingly, the quantum dots can be accurately electrically accessible via such electrodes, and the quantum dots can be electrically accessible independently of each other.

The above-described object is also achieved by a quantum semiconductor device comprising: a quantum dot formed on a semiconductor substrate; a first semiconductor layer formed, burying the quantum dot; a semiconductor dot formed on the first semiconductor layer in a position above the quantum dot; a dot-shaped oxide formed of the partially oxidized semiconductor dot; a second semiconductor layer formed, burying the semiconductor dot; and an electrode formed in a concavity formed in a surface of the second semiconductor layer in a position above the dot-shaped oxide.

The above-described object is also achieved by a method for fabricating a quantum semiconductor device comprising the steps of: forming a quantum dot on a semiconductor substrate; forming a semiconductor layer, burying the quantum dots; and forming an electrode by self-alignment above a position where strains are generated in the semiconductor layer because of the quantum dot.

The above-described object is also achieved by a method for fabricating a quantum semiconductor device comprising the steps of: forming a quantum dot on a semiconductor substrate; forming a semiconductor layer, burying the quantum dot; forming a semiconductor dot on the semiconductor layer in a position above the quantum dot; oxidizing the semiconductor dot and the semiconductor layer immediately below the semiconductor dot to form a dot-shaped oxide partially buried in the semiconductor layer; removing the dot-shaped oxide to form a concavity in a surface of the semiconductor layer; and forming an electrode in the concavity formed in the surface of the semiconductor layer.

The above-described object is also achieved by a method for fabricating a quantum semiconductor device comprising the steps of: forming a quantum dot on a semiconductor substrate; forming a first semiconductor layer, burying the quantum dot; forming a semiconductor dot on the first semiconductor layer in a position above the quantum dot; oxidizing a part of the semiconductor dot to form a dot-shaped oxide of the partially oxidized semiconductor dot; forming a second semiconductor layer, burying the dot-shaped oxide and the semiconductor dot with a concavity formed in a surface in a position above the dot-shaped oxide, and forming an electrode in the concavity formed in the surface of the second semiconductor layer.

According to the present invention, the concavity is formed in the semiconductor substrate by forming the dot-shaped on the surface of the semiconductor substrate by AFM oxidation and removing the oxide, whereby the concavity can be formed precisely in a prescribed position and in a prescribed size. In such a concavity, the quantum dot is grown, whereby the quantum dot can have good quality and can be formed in a prescribed position and in a prescribed size. According to the present invention, the quantum dot of good quality can be formed in a prescribed position and in a prescribed size, whereby quantum dots which are usable in the fields of quantum information and quantum computation, etc. can be formed.

According to the present invention, on the semiconductor substrate, the quantum dot is formed, the semiconductor layer is formed, burying the quantum dot, the electrode is formed by self-alignment above the position where strains are generated in the semiconductor layer because of the quantum dot, whereby the electrodes can be formed accurately above the respective quantum dots. Accordingly, the quantum dots can be accurately electrically accessible via such electrodes, and the quantum dots can be electrically accessible independently of each other.

According to the present invention, on the semiconductor substrate, the quantum dot is formed, the semiconductor layer is formed, burying the quantum dot, the semiconductor dot is formed on the semiconductor layer in the position above the quantum dot, and the semiconductor dot and the semiconductor layer immediately below the semiconductor dot are oxidized, whereby the dot-shaped oxide partially buried in the semiconductor layer is formed, and the dot-shaped oxide is removed to thereby form the concavity in the surface of the semiconductor layer, and the electrode is formed in the concavity formed in the surface of the semiconductor layer, whereby the electrodes can be formed accurately above the respective quantum dots. Accordingly, the quantum dots can be accurately electrically accessible via such electrodes, and the quantum dots can be electrically accessible independently of each other.

Furthermore, according to the present invention, on the semiconductor substrate, the quantum dot is formed, a first semiconductor layer is formed, burying the quantum dot, the semiconductor dot is formed on the first semiconductor layer in the position above the quantum dot, a part of the semiconductor dot is oxidized to form a dot-shaped oxide of the partially oxidized semiconductor dot, a second semiconductor layer is formed, burying the dot-shaped oxide and the semiconductor dot so that the concavity is formed in the surface in the position above the dot-shaped oxide, and the electrode is formed in the concavity formed in the surface of the second semiconductor layer, whereby the electrodes can be formed accurately above the respective quantum dots. Accordingly, the quantum dots can be made accurately electrically accessible via such electrodes, and the quantum dots can be made electrically accessible independently of each other.

BEST MODE FOR CARRYING OUT THE INVENTION

A First Embodiment

The method for forming a quantum dot according to a first embodiment of the present invention will be explained with reference to FIGS. 1 to 5.

The method for forming a quantum dot according to the present embodiment mainly comprises the step of forming an oxide in a dot-shape on the surface of a semiconductor substrate, the step of removing the oxide to form a concavity in the position where the oxide has been removed, and the step of growing a semiconductor layer on the semiconductor substrate with the concavity formed in to form a quantum dot of the semiconductor layer in the concavity.

(a) To Form an Oxide

Figure 1:
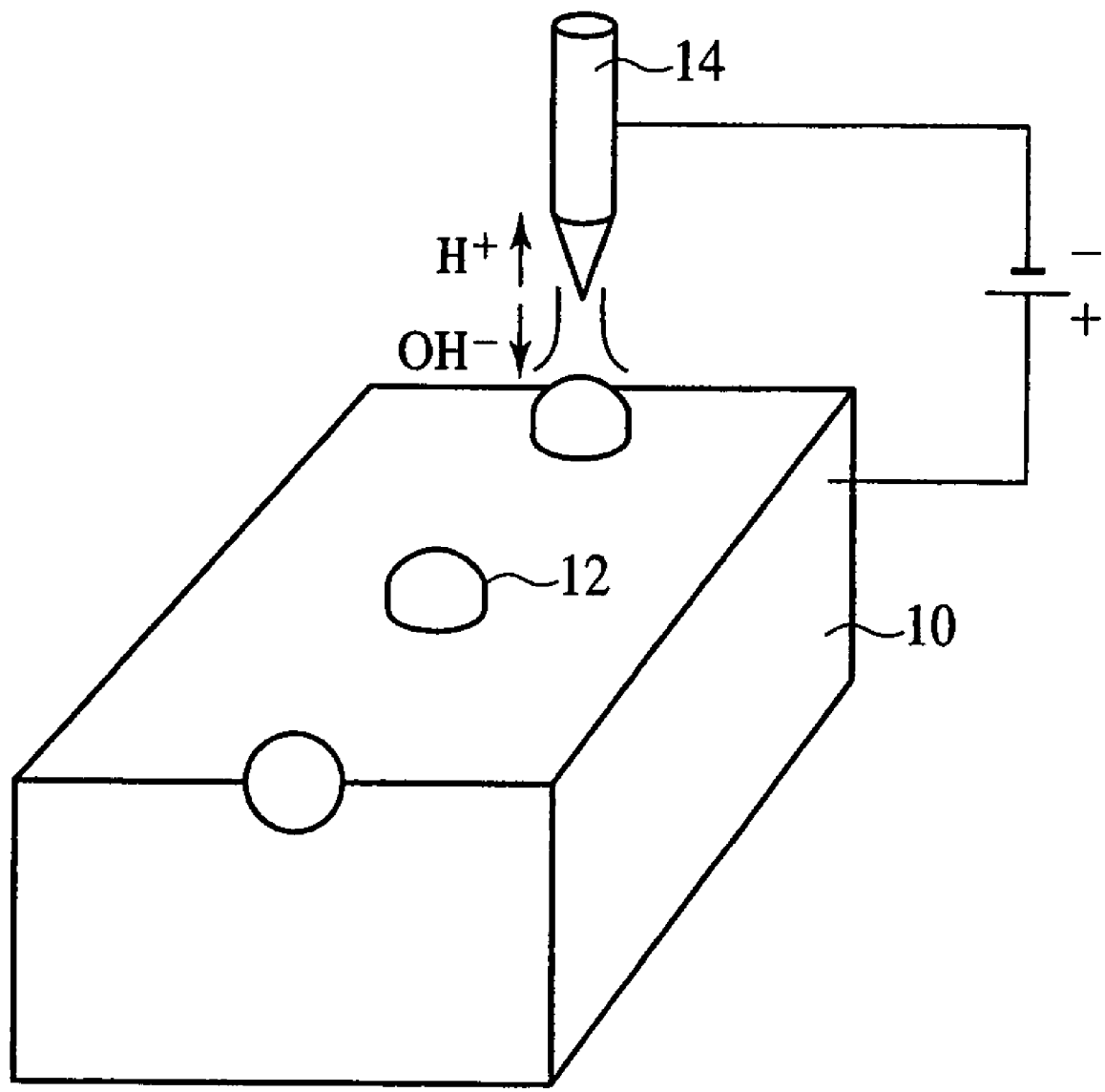
FIG. 1 is a view illustrating a step of a method for forming a quantum dot according to a first embodiment of the present invention (Part 1).

First, the step of forming an oxide in a dot-shape on the surface of a semiconductor substrate will be explained with reference to FIG. 1. FIG. 1 is a view illustrating a step of a method for forming a quantum dot according to the present embodiment (Part 1). FIG. 1 is a perspective view.

As illustrated in FIG. 1, a semiconductor substrate 10 of, e.g., GaAs heavily doped with an impurity is prepared.

Then, an oxide 12 is formed in a dot-shape on the surface of the semiconductor substrate 10 by AFM oxidation.

AFM oxidation is a method for forming an oxide on the surface of a sample by approaching the probe of an AFM to the sample and applying a voltage between the AFM probe and the sample.

As illustrated in FIG. 1, when the AFM probe 14 is brought near to the semiconductor substrate 10, a negative bias is applied to the probe 14, and a positive bias is applied to the semiconductor substrate 10, water contained in the atmospheric air is dissociated as follows near the forward end of the probe 14, and oxidation reaction takes place on the surface of the semiconductor substrate 10.

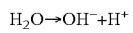

When the semiconductor substrate 10 is, e.g., a GaAs substrate, the following oxidation reaction takes place on the surface of the semiconductor substrate 10.

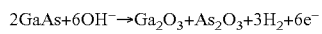

The oxidation reaction using a GaAs substrate as the semiconductor substrate 10 is used here. However, the semiconductor substrate 10 is not essentially a GaAs substrate. An oxide can be similarly formed on the surface of a semiconductor substrate of another material.

The AFM probe 14 is stopped when the oxide 12 is formed on the surface of the semiconductor substrate 10. This is because the oxidation reaction is caused to take place with the AFM probe 14 stopped, whereby the formed oxide 12 can have substantially circular plane shape.

The ambient atmosphere for AFM oxidation is, e.g., the atmospheric air.

The humidity of the ambient atmosphere for AFM oxidation is, e.g., 40-60%. However, the humidity of the ambient atmosphere for AFM oxidation is not essentially 40-60% and can be suitably set in a range which can cause the oxidation reaction.

The operation mode of the AFM is, e.g., contact mode. The contact mode is an operation mode in which the probe scans the surface of a sample in contact therewith.

The voltage to be applied between the probe 14 and the semiconductor substrate 10 in AFM oxidation is, e.g., 3-7 V.

The period of time of the oxidation reaction is, e.g., 1-20 seconds.

Generally, as the voltage applied between the probe 14 and the semiconductor substrate 10 is higher, the size of the formed oxide 12 tends to be larger. The size of the formed oxide 12 tends to be larger as the oxidation reaction is caused to take place longer. However, when the voltage between the probe 14 and the semiconductor substrate 10 is too high, the size of the formed oxide 12 become non-uniform. On the other hand, when the voltage applied between the probe 14 and the semiconductor substrate 10 is too low, the oxidation reaction does not take place. Accordingly, the applied voltage and the oxidation period of time are set suitably so that the oxide 12 of a prescribed size can be formed.

For example, when the applied voltage is set at, e.g., 5 V, and the oxidation period of time is set at, e.g., 4 seconds, the oxide 12 of, e.g., a 50 nm-diameter can be formed.

When the applied voltage is set to be as low as, e.g., 3 V, and the oxidation period of time is set at, e.g., 4 seconds, the oxide 12 is as small as, e.g., 20 nm-diameter.

When the probe is formed of a carbon nanotube, the oxide 12 of an about 10 nm-diameter, which is very small, can be formed. This is because the probe 14 formed of a carbon nanotube can have a much fine forward end.

The carbon nanotube is a self-assembled nanostructure which is a cylindrical structure formed of carbon atoms.

The thus formed oxide 12 has the substantially lower half buried in the semiconductor substrate 10 and the substantially upper half exposed out of the semiconductor substrate 10.

In the above, the AFM mode is the contact mode but is not essentially limited to the contact mode. The operation mode of the AFM can be set suitably at any other operation mode as long as the operation mode can perform AFM oxidation. For example, the operation mode may be the tapping mode. The tapping mode is an operation mode in which a cantilever supporting the probe is oscillated near the resonance frequency with the probe scanning the surface of a sample intermittently in contact therewith. It is preferable that the applied voltage is set higher in the tapping mode than in the contact mode.

In the above, the oxidation reaction is caused to take place with the AFM probe 14 stopped. However, in the case that the specifications of the AFM do not permit to keep the probe 14 at pause, the scan rate is set to be as low as possible. In the case that the oxidation reaction is caused to take place with the probe 14 on move, the plane shape of the oxide 12 becomes long narrow. Therefore, the displacement distance of the probe 14 in the oxidation reaction is preferably set at, e.g., below 5 nm including 5 nm.

Figure 2:
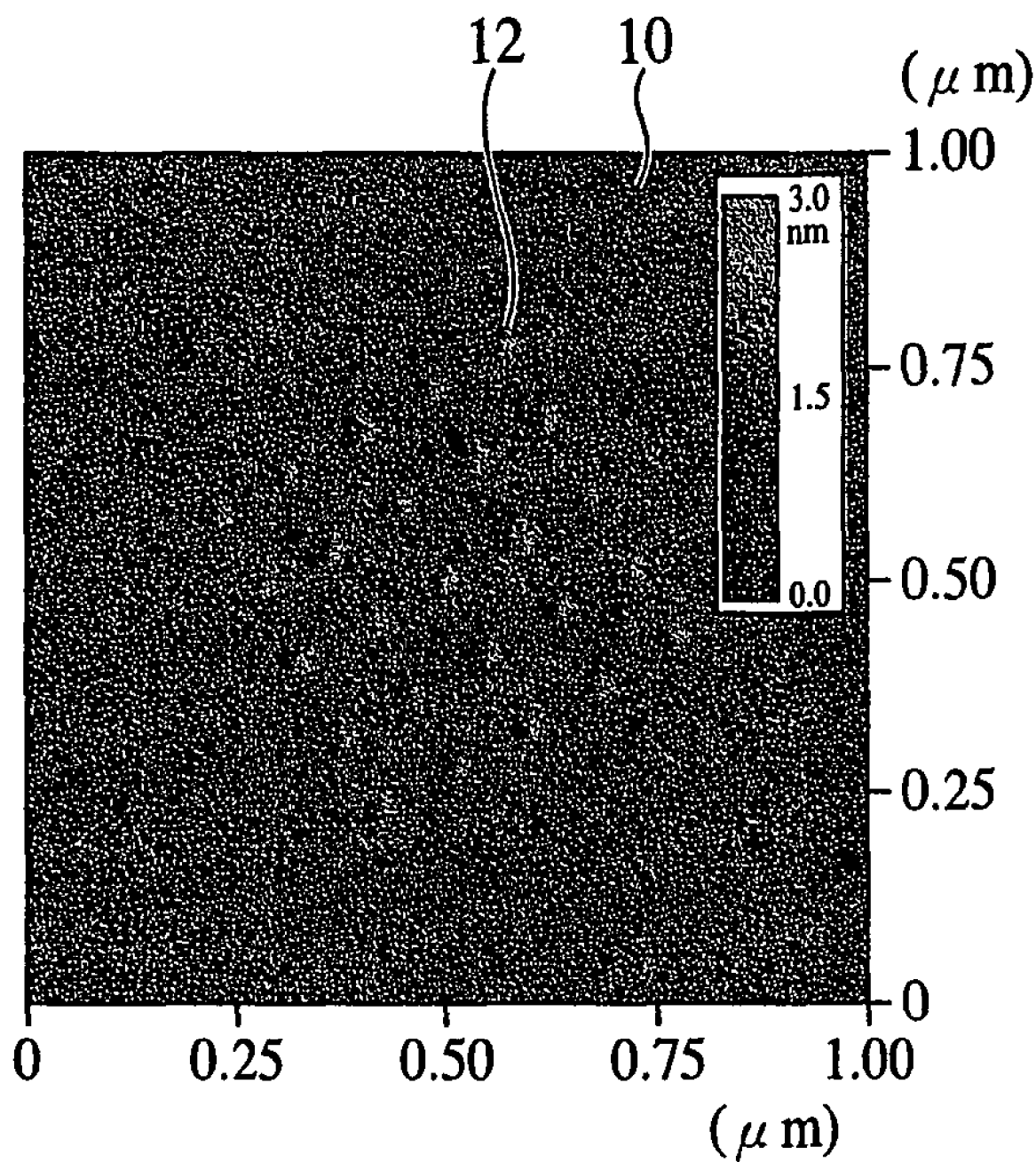
FIG. 2 is an AFM image of a state that the dot-shaped oxides are formed on the surface of the semiconductor substrate.

FIG. 2 is an AFM image of a state of the surface of the semiconductor substrate with the oxides formed in a dot-shape.

The semiconductor substrate 10 was an n$^+$ type (001) GaAs substrate with Si doped in the surface in a 2×10$^{18}$ cm$^{-2}$ concentration. The voltage applied between the probe 14 and the semiconductor substrate 10 was 4 V. The oxidation period of time for each position was 8 seconds.

As seen in FIG. 2, the oxides 12 are formed in a dot-shape almost equidistantly in prescribed positions.

The plane shape of each oxide 12 is substantially circular.

The diameter of the oxide 12 is substantially uniform, specifically about 35-45 nm.

The height of the oxide 12 is substantially uniform, specifically about 0.6-0.8 nm.

As described above, in the present embodiment, the oxide 12 is formed on the surface of the semiconductor substrate 10 by AFM oxidation, whereby the oxide 12 can be formed in a dot-shape in a prescribed position and in a prescribed size.

(b) To Remove the Oxide

Then, the step of removing the oxide to form a concavity in the position where the oxide has been removed will be explained with reference to FIG. 3. FIG. 3 is views illustrating steps of the method for forming a quantum dot according to the present embodiment (Part 2). FIG. 3 is sectional views.

Figure 3A:
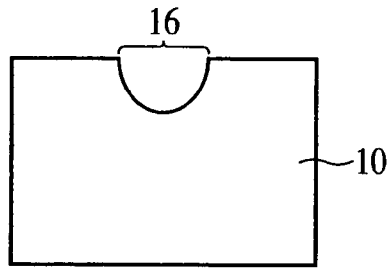
FIG. 3 is views illustrating steps of the method for forming the quantum dot according to the first embodiment of the present invention (Part 2).
Figure 3B:
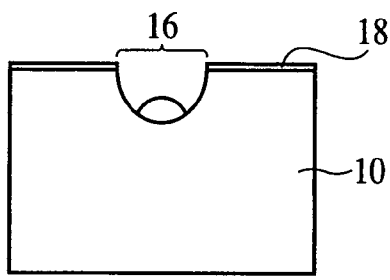
Figure 3C:
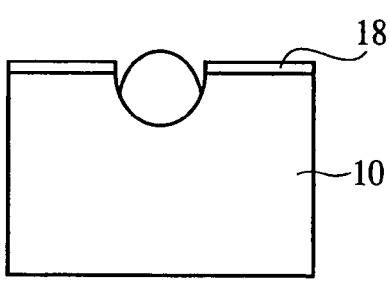
Figure 3D:
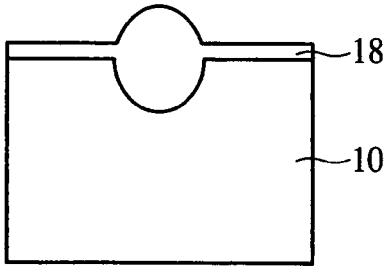

As illustrated in FIG. 3A, the oxide 12 formed on the surface of the semiconductor substrate 10 is removed by, e.g., chemical etching.

As the etchant, an etchant which can selectively remove the oxide 12 without etching the semiconductor substrate 10 is suitably used. The oxide 12 formed by AFM oxidation is substantially the same as the oxide 12 formed by wet oxidation in the usual semiconductor device fabrication process. Accordingly, the same etchant as used in the usual semiconductor device fabrication process is suitably used, whereby the oxide 12 can be selectively etched off without etching the semiconductor substrate 10.

When the semiconductor substrate 10 is a GaAs substrate, the etchant is, e.g., diluted HCl.

The etchant is diluted HCl here. However, the etchant is not limited to diluted HCl, and any etchant can be suitably used as long as the etchant can etch selectively the oxide 12 without etching the semiconductor substrate 10. For example, diluted hydrofluoric acid, diluted ammonia ($NH_4OH$), or others may be used.

The etching period of time may be suitably set so that the oxide 12 can be selectively etched off without affecting the surface of the semiconductor substrate 10.

For example, when the semiconductor substrate 10 is a GaAs substrate, and the oxide is selectively etched off by using an etchant of $HCl:H_2O=1:20$-$1:100$, the etching period of time is, e.g., 30 seconds to about several minutes.

When the concentration of the etchant is not so high, the etching period of time may not be strictly set, without remarkable problems.

The temperature for etching off the oxide 12 is, e.g., the room temperature.

When the oxide 12 is thus removed from the surface of the semiconductor substrate 10, a concavity 16 is formed in the position where the oxide 12 has been removed. The configuration of the concavity 16 is substantially the same as that of the oxide 12 which has been buried there.

It has been conventionally difficult to form a concavity of, e.g., a below 40 nm-diameter including 40 nm-diameter. In the present embodiment, however, as described above, the oxide 12 can be formed in, e.g., a 30 nm-diameter or less, which makes it possible to form the concavity 16 of, e.g., a below 40 nm-diameter including 40 nm-diameter.

As described above, the voltage to be applied between the probe 14 and the semiconductor substrate 10 is set to be low, and the oxidation period of time is set to be short, the oxide 12 can be formed, in a below 20 nm-diameter including 20 nm-diameter, whereby the concavity 16 of, e.g., a below 20 nm-diameter including 20 nm-diameter can be formed.

As described above, with the probes 14 formed of a carbon nanotube, the oxide 12 can be formed in, e.g., about 10 nm-diameter, whereby the concavity 16 can be formed in a much fine diameter as fine as, e.g., about 10 nm-diameter.

Figure 4:
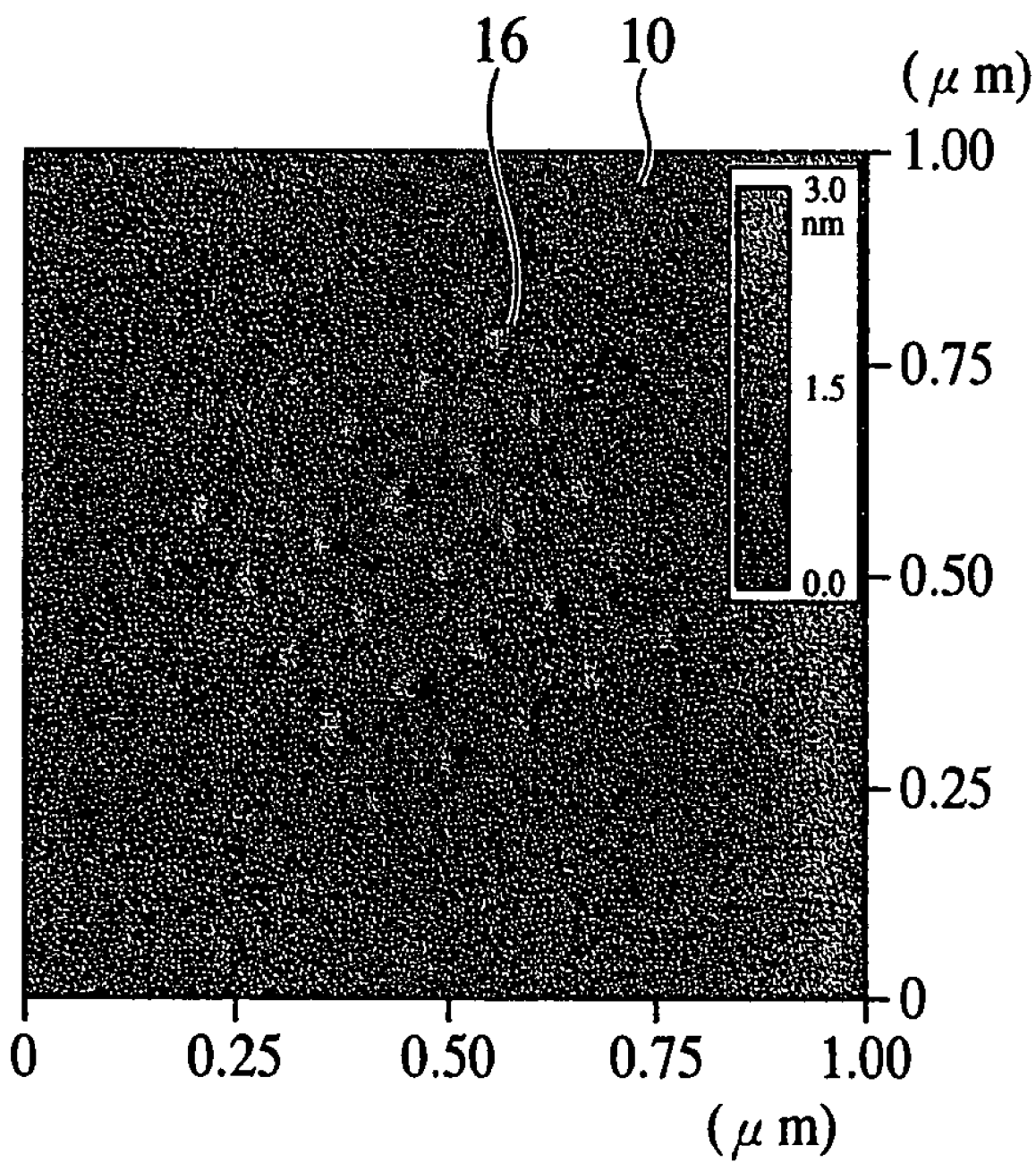
FIG. 4 is an AFM image of a state that the oxides have been removed.

FIG. 4 is an AFM image of a state of the semiconductor substrate with the oxide removed.

The etchant was an etchant of $HCl:H_2O=1:50$. Conditions for the etching were the room temperature and 1 minute.

As seen in FIG. 4, the concavities 16 are formed in the positions where the oxides 12 have been removed.

The diameter of the concavities 16 is substantially uniform, specifically about 35-45 nm.

The depth of the concavities 16 is below 0.8 nm including 0.8 nm.

The roughness of the surface of the semiconductor substrate 10 is below 0.3 nm including 0.3 nm. This means that the surface of the semiconductor substrate 10, which should not be etched, has not been etched.

As described, the oxide 12 formed on the semiconductor substrate 10 can be selectively removed by chemical etching.

After the oxide 12 has been removed, the etchant staying on the surface of the semiconductor substrate 10 is washed away with a deionized water.

Then, for example, nitrogen gas is blown to the surface of the semiconductor substrate 10 to hereby dry the surface of the semiconductor substrate 10.

In the above, the oxide 12 formed on the semiconductor substrate 10 is chemically etched off but can be etched off not only by chemical etching, but also by another method.

For example, the oxide 12 can be selectively removed by, e.g., applying ultrasonic waves as follows.

As means for applying ultrasonic waves, an ultrasonic cleaner is used here. However, the means for applying ultrasonic waves is not essentially an ultrasonic cleaner and can be any of a wide variety of means as long as the means can apply ultrasonic waves to the semiconductor substrate.

First, the semiconductor substrate 10 with the oxide 12 formed on is immersed in the cleaning vessel (not illustrated) of an ultrasonic cleanser (not illustrated) containing deionized water.

Then, ultrasonic waves are applied to the cleaning vessel. The power of the ultrasonic waves to be applied is, e.g., 100 W. The application period of time of the ultrasonic waves is, e.g., several minutes to about 2 hours. Thus, the oxide 12 formed on the semiconductor substrate 10 is removed.

The mechanism for removing oxide 12 from the surface of the semiconductor substrate 10 by the application of ultrasonic waves will be as follows.

That is, the atomic bonding is weaker in the interface between the oxide 12 and the semiconductor substrate 10, and when ultrasonic waves are applied, the oxide 12 is released from the surface of the semiconductor substrate 10. On the other hand, the power of the applied ultrasonic waves, however, is not so high as to break the atomic bonding of the semiconductor substrate 10 itself. Thus, by applying ultrasonic waves, the oxide 12 can be selectively removed from the surface of the semiconductor substrate 10.

As described above, the oxide 12 can be selectively removed from the semiconductor substrate 10 by applying ultrasonic waves.

After the oxide 12 has been removed, nitrogen gas, for example, is blown to the semiconductor substrate 10 to thereby dry the surface of the semiconductor substrate 10.

(c) To Form a Quantum Dot

Then, the step of growing a semiconductor layer on the semiconductor substrate with the concavity formed in to form a quantum dot of the semiconductor layer in the concavity will be explained with reference to FIG. 3.

First, the semiconductor substrate 10 is loaded into the vacuum chamber of a deposition apparatus and pre-baked, e.g., for 1 hour at about 250° C.

Next, the semiconductor substrate 10 is loaded into the deposition chamber of the deposition apparatus to heterogrow the semiconductor layer 18 by, e.g., MBE or MOCVD. For example, the material of the semiconductor layer 18 can be a material whose band gap is narrower than that of the material of the semiconductor substrate 10 and whose lattice constant is larger than that of the semiconductor substrate 10.

For example, when the material of the semiconductor substrate 10 is GaAs, the material of the semiconductor layer 18 can be, e.g. InGaAs.

When the semiconductor layer 18 is grown in vapor phase on the semiconductor substrate 10 with the concavity 16 formed in, the growth rate of the semiconductor layer 18 at the concavity 16 tends to be faster than the growth rate of the semiconductor layer 18 in the flat region of the semiconductor substrate 10 other than the concavity 16. Thus, as illustrated in FIGS. 3B to 3E, the quantum dot 20 of the semiconductor layer 18 are grown largely in the concavity 16.

Figure 3E:
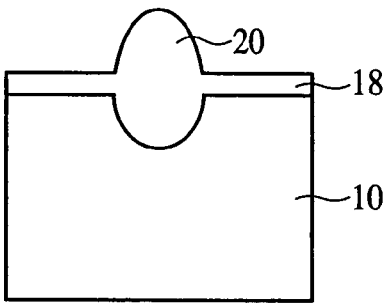

As illustrated in FIG. 3E, the upper part of the quantum dot 20 is projected upward beyond the upper surface of the semiconductor layer 18 which has been formed in the flat region of the semiconductor substrate 10 except the concavity 16.

The growth rate of the quantum dot 20 tends to be dependent on the size of the concavity 16. Accordingly, as the concavity 16 has a larger diameter, the quantum dot 20 having a larger diameter and higher height tends to be formed. Accordingly, the diameters of the concavities 16 are suitably set, whereby the quantum dots 20 having different sizes can be suitably set.

The diameter of the quantum dot 20 tends to be substantially equal to the diameter of the concavity 16. Accordingly, the growth periods of time of the quantum dots 20 are suitably set, whereby the quantum dots 20 having a uniform diameter and different heights can be suitably set.

Figure 5:
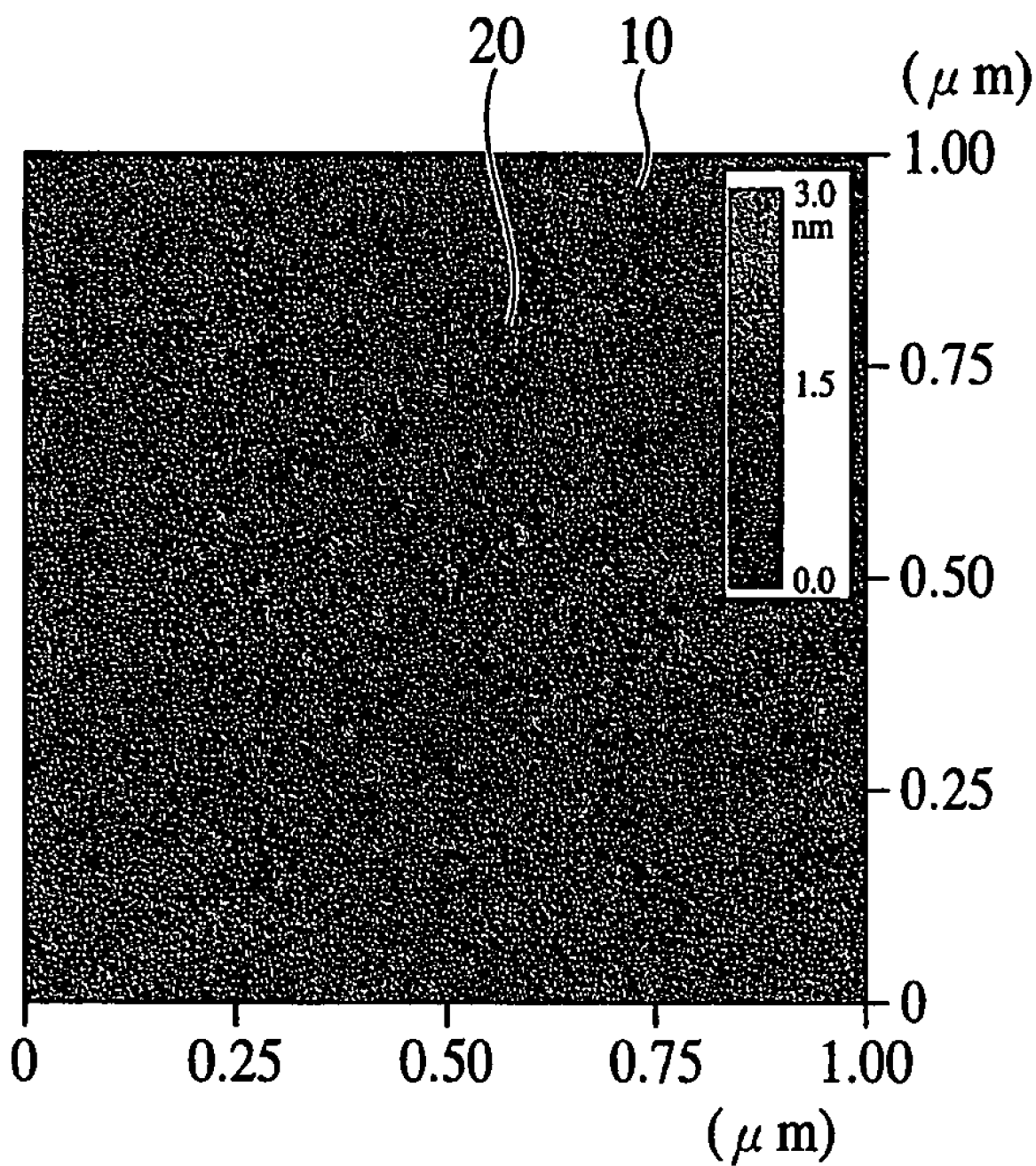
FIG. 5 is an AFM image of a state that the quantum dots are formed.

FIG. 5 is an AFM image of a state of the semiconductor substrate with the quantum dots formed on.

The material of the semiconductor layer 18 was $In_{0.4}Ga_{0.6}As$. The semiconductor layer 18 was grown under conditions for growing a 4.4 atom layer. The temperature inside the deposition chamber was 480° C.

As seen in FIG. 5, the quantum dots 20 are formed in a substantially uniform size in the concavities 16 formed in the semiconductor substrate 10.

Thus, according to the present embodiment, the quantum dots 20 can be formed in a substantially uniform size in the positions where the concavities 16 are formed.

After the step of removing the oxide 12 and before the step of forming the quantum dot 20, a smooth layer (not illustrated) for smoothing the rough surface of the semiconductor substrate 10 may be formed. When the semiconductor layer 18 is formed on the rough surface of the semiconductor substrate 10, there is a risk that the quantum dot 20 may be formed on the semiconductor substrate 20 in the region other than the concavity 16. However, when the smooth layer is formed on the semiconductor substrate 10, the surface of the semiconductor substrate 10 is smoothed, whereby the formation of quantum dots on the semiconductor substrate 10 in the region other than the concavity 16 can be prevented. The thickness of the smooth layer may be set suitably not to make the concavity 16 too shallow and may be, e.g., below 1 nm including 1 nm.

As described above, according to the present embodiment, the dot-shaped oxide is formed on the surface of a semiconductor substrate by AFM oxidation, and the oxide is removed to thereby form the concavity in the semiconductor substrate, whereby the concavity can be formed precisely in a prescribed position and in a prescribed size the Quantum dot is formed in such-formed concavity, whereby the quantum dot of good quality can be formed in a prescribed position and in a prescribed size.

According to the present embodiment, the quantum dot can be formed in a prescribed position and in a prescribed size, whereby the quantum dot which can be used in the fields of quantum information and quantum computation, etc. can be formed. According to the present embodiment, the quantum dot is usable in the quantum computer proposed in, e.g., Phys. Rev. A 62, 062316, (2000).

(A Modification)

Figure 6:
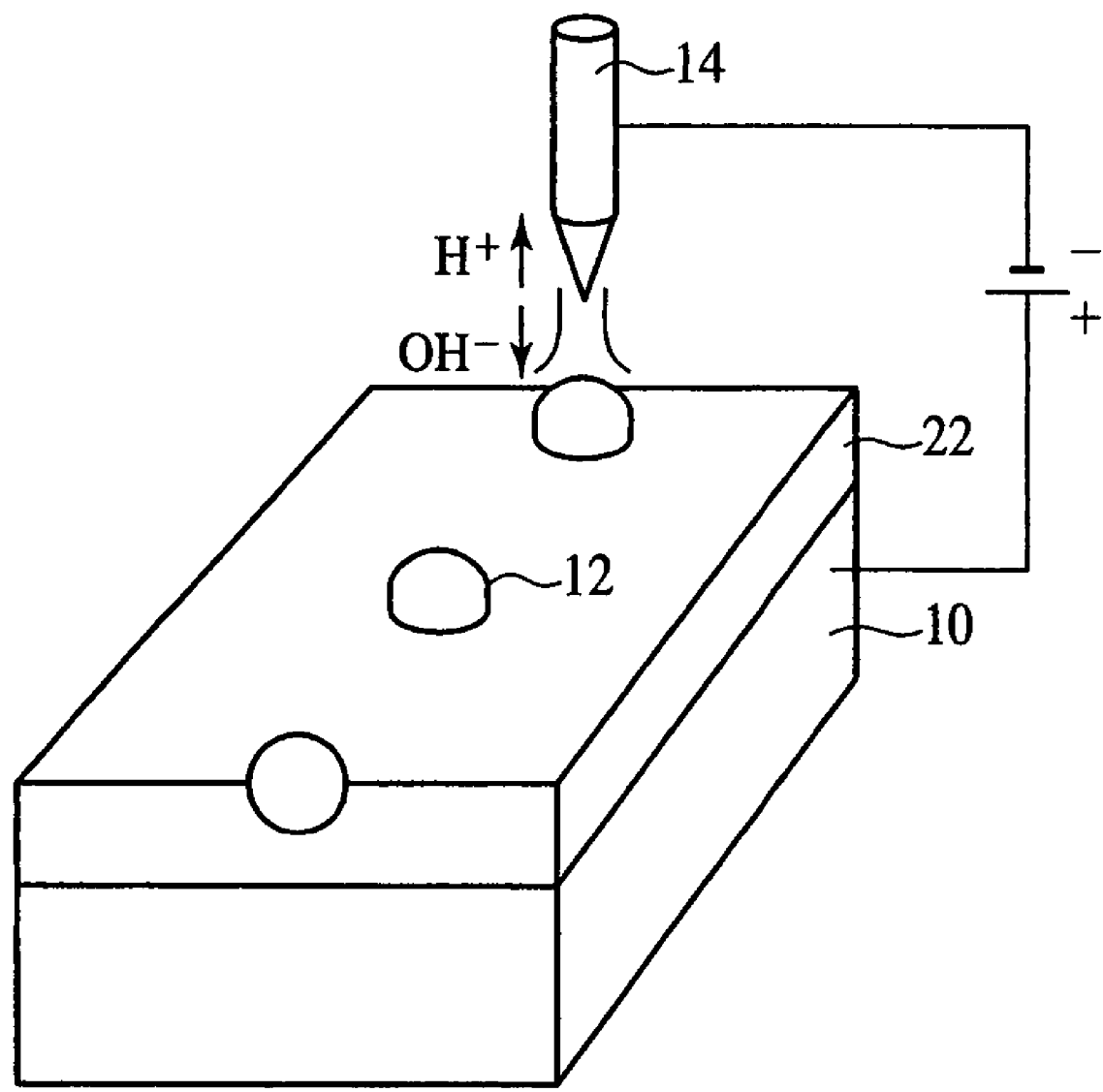
FIG. 6 is a view illustrating a step of the method for forming a quantum dot according to a modification of the first embodiment of the present invention (Part 1).

Next, the method for forming a quantum dot according to one modification of the present embodiment will be explained with reference to FIGS. 6 and 7. FIGS. 6 and 7 are views illustrating steps of the method for forming a quantum dot according to the present modification. FIG. 6 is a perspective view, and the FIG. 7 are sectional views.

The method for forming a quantum dot according to the present modification is characterized mainly in that a semiconductor layer 22 having a smooth surface is formed on the semiconductor substrate 10.

First, as illustrated in FIG. 6, the semiconductor layer 22 of a 300 nm-thickness GaAs is formed on the entire surface of the semiconductor substrate 10 by, e.g., MBE. The surface roughness of the semiconductor layer 22 is as small as possible and is preferably, e.g., below 0.5 nm including 0.5 nm.

Then, the oxide 12 is formed in a dot-shape on the surface of the semiconductor layer 22. Conditions for forming the oxide 12 may be, e.g., the same as described above. According to the present modification, the semiconductor layer 22 having a smooth surface is formed on the semiconductor substrate 10, and the oxide 12 is formed on the semiconductor layer 22, whereby even when the surface of the semiconductor substrate 10 itself is rough, the oxide 12 can be formed in a prescribed size in a prescribed position.

Figure 7A:
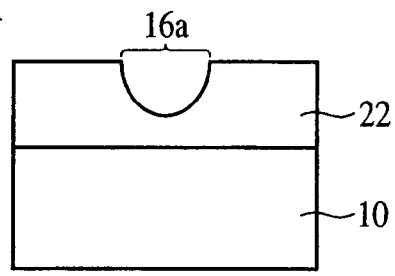
FIG. 7 is views illustrating steps of the method for forming the quantum dot according to the modification of the first embodiment of the present invention (Part 2).
Figure 7B:
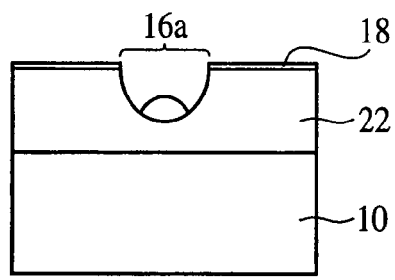
Figure 7C:
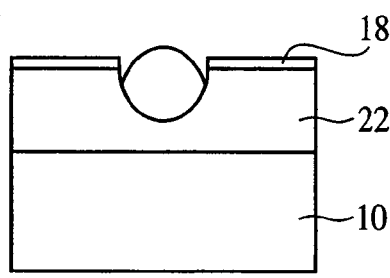
Figure 7D:
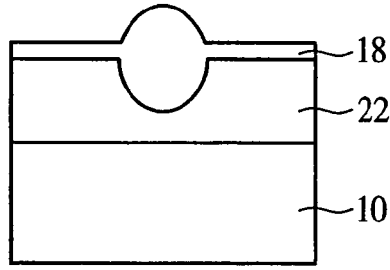
Figure 7E:
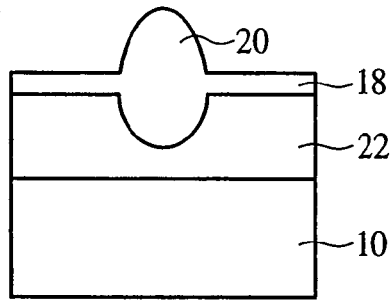

Next, as illustrated in FIG. 7A, the oxide 12 is removed. The oxide 12 can be removed in the same way as described above. Thus, concavity 16a is formed in the semiconductor layer 22 in the position where the oxide 12 has been removed.

Then, as illustrated in FIGS. 7B to 7E, the semiconductor layer 18 is hetero-grown. The semiconductor layer 18 can be formed in, e.g., the same way as described above. Thus, quantum dot 20 of the semiconductor layer 18 is formed in the concavity 16a. According to the present modification, the semiconductor layer 18 is hetero-grown on the semiconductor layer 22, whose surface is smooth, whereby even when the surface of the semiconductor substrate 10 itself is rough, the formation of the quantum dot in the region other than the concavity 16a can be prevented.

As described above, according to the present modification, the semiconductor layer 22, whose surface is smooth, is formed on the semiconductor substrate 10, whereby even when the surface of the semiconductor substrate 10 itself is rough, the quantum dot 20 can be formed in a prescribed position and in a prescribed size without being influenced by the surface roughness of the semiconductor substrate 10.

A Second Embodiment

Figure 8:
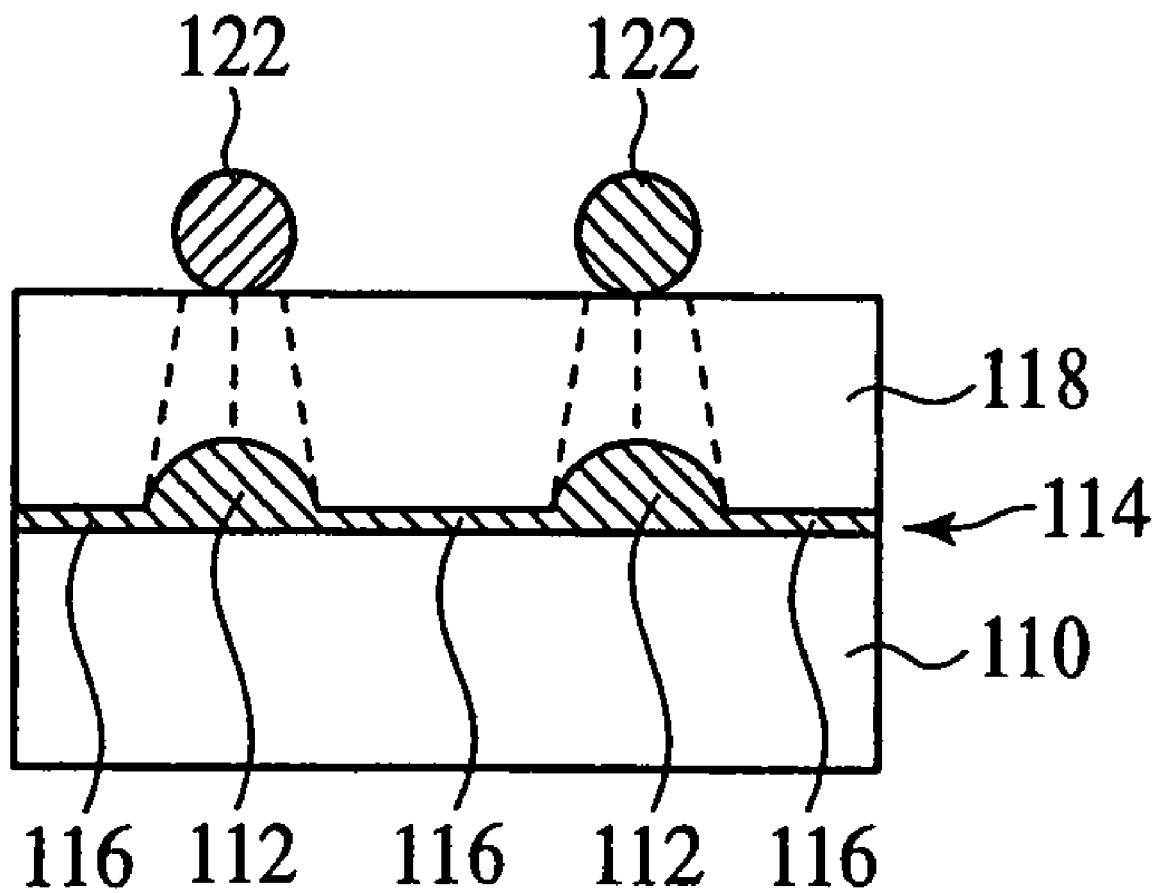
FIG. 8 is a sectional view of the quantum semiconductor device according to a second embodiment of the present invention, which illustrates a structure thereof.
Figure 9:
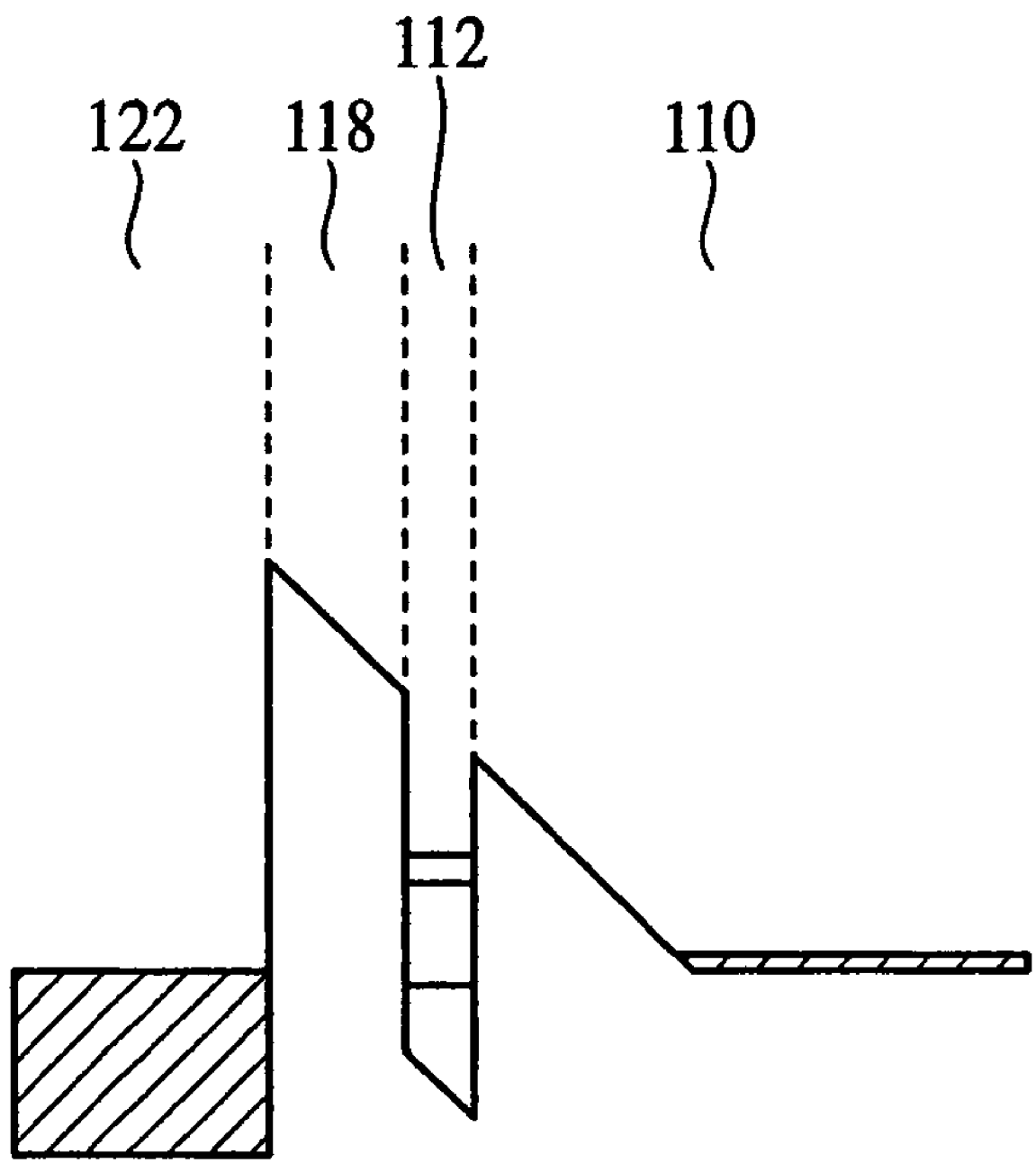
FIG. 9 is a view of an energy band structure of the quantum semiconductor device according to the second embodiment of the present invention.

The quantum semiconductor device according to a second embodiment of the present invention and the method for fabricating the quantum semiconductor device will be explained with reference to FIGS. 8 to 10. FIG. 8 is a sectional view of the quantum semiconductor device according to the present embodiment, which illustrates a structure thereof. FIG. 9 is a view of an energy band structure of the quantum semiconductor device according to the present embodiment. FIG. 10 is sectional views of the quantum semiconductor device according to the present embodiment in the steps of the method for fabricating the quantum semiconductor device, which illustrate the method.

First, the structure of the quantum semiconductor device according to the present embodiment will be explained with reference to FIG. 8.

A quantum dot layer 114 of a semiconductor including self-assembled quantum dots 112 is formed on a semiconductor substrate 110. The quantum dot layer 114 includes the quantum dots 112 in the form of three-dimensionally grown islands self-assembled on the semiconductor substrate 110 by S-K mode, and a wetting layer 116 formed on the semiconductor substrate 10 between the quantum dots 112.

A cap layer, i.e., a semiconductor layer 118 is formed on the quantum dot layer 114. In the semiconductor layer 118 on the quantum dots 112, strains are generated due to the lattice mismatching between the material of the quantum dots 112 and the material of the semiconductor layer 118. In FIG. 8, the regions of the semiconductor layer 118, where the strains are generated, are indicated by the dot lines.

On the surface of the semiconductor layer 118 in the positions where the strains are generated, metal particle-shaped electrodes 122 are formed.

The quantum semiconductor device according to the present embodiment is characterized mainly in that the electrodes 122 are formed by self-alignment on the surface of the semiconductor layer 118 in positions where strains are generated, i.e., the metal particle-shaped electrodes 122 are formed accurately above the respective quantum dots 112.

As described above, because of strains generated in the semiconductor layer 118 on the quantum dots 112, the electrodes 122 are formed accurately above the respective quantum dots 112, whereby the quantum dots 112, which have been self-assembled are made electrically accessible with precision via such electrodes 122. Also, The quantum dots 112, which have been self-assembled, can be made electrically accessible independently of each other.

The energy band structure of the quantum semiconductor device according to the present embodiment is as illustrated in FIG. 9.

Then, the method for fabricating the quantum semiconductor device according to the present embodiment will be explained with reference to FIG. 10.

First, the quantum dot layer 114 is formed on the semiconductor substrate 110 by, e.g., MBE (Molecular Beam Epitaxy). In the quantum dot layer 114, the quantum dots 112 are self-assembled by S-K mode. (see FIG. 10A). The quantum dot layer 114 is formed of a material whose lattice constant is different from that of the material of the semiconductor substrate 110 resultantly for large lattice mismatching. For example, when the semiconductor substrate 110 is a GaAs substrate, the quantum dot layer 114 can be formed of, e.g., InAs.

Figure 10A:
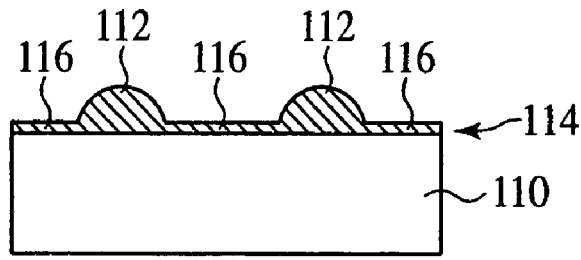
FIG. 10 is sectional views of the quantum semiconductor device in the steps of the method for fabricating the quantum semiconductor device according to the second embodiment of the present invention.
Figure 10B:
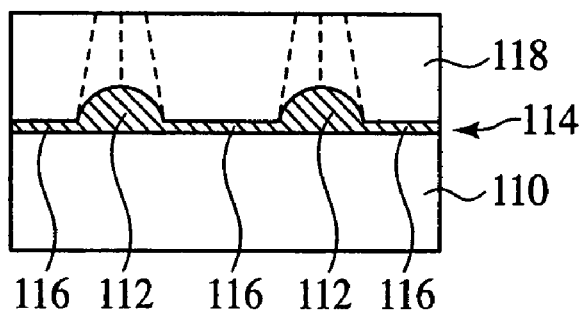

Then, the semiconductor layer 118 is formed on the quantum dot layer 114 by, e.g., MBE (see FIG. 10B). The semiconductor layer 118 is formed of a material whose lattice constant is different from that of the material of the quantum dot layer 114 resultantly for large lattice mismatching. When the quantum dot layer 14 is formed of InAs, the semiconductor layer 118 is formed of, e.g., GaAs.

In the semiconductor layer 118 on the quantum dots 112, strains are generated due to the lattice mismatching with the quantum dots 112.

It is preferable that the semiconductor layer 118 is formed relatively thin so that the strains are generated sufficiently up to the surface thereof. For example, the growth of the semiconductor layer 118 by MBE is stopped when the semiconductor layer 118 has buried the upper end of the quantum dots 112. The thickness of the semiconductor layer 118 is, e.g., below 10 nm including 10 nm, more preferably below 5 nm including 5 nm. The reason for forming the semiconductor layer 118 thin will be detailed.

Next, metal droplets are deposited on the surface of the semiconductor layer 118 by a droplet epitaxy method to form the metal particle-shaped electrode 122. The droplet epitaxy method here is the technique for depositing atoms and molecules of evaporated metal on the surface of a material such as e.g., an insulator, a semiconductor or others having a surface energy which is lower than that of a metal to thereby grow fine particles. In this method, the action which minimizes the energy of a system takes place, whereby the metal grows in fine particles so as to minimize the surface area of the insulator, metal or others. The electrodes 122 can be formed of Ga, In, Al, Au or an alloy of them.

The electrodes 122 can be formed in the epitaxial growth chamber of the deposition apparatus used in forming the semiconductor layer 118 in a step continuously following the step of forming the semiconductor layer 118.

When the semiconductor layer 118 and the electrodes 122 are formed in the continuous steps, after the semiconductor layer 118 has been formed in the epitaxial growth chamber by MBE, the deposition of the semiconductor forming the material of the semiconductor layer 118 is stopped.

For example, when a III-V semiconductor has been deposited to form the semiconductor layer 118, the supply of the V element into the epitaxial growth chamber is stopped.

The supply of the V element is stopped, and the metal beams of the III element alone are applied to the surface of the semiconductor layer 118, and metal droplets of the III element are deposited on the surface of the semiconductor layer 118.

The metal droplets deposited on the surface of the semiconductor layer 118 by the droplet epitaxy method are moved to positions where strains have been generated in the surface of the semiconductor layer 118.

By cooling following the deposition of the metal droplets, the metal droplets are solidified, and the particles of the metal are formed. Thus, the metal particle-shaped electrodes 122 are formed accurately in the positions where the strains are generated in the surface of the semiconductor layer 118, i.e., on the surface of the semiconductor layer 118 above the respective quantum dots 112 buried in the semiconductor layer 118. That is, the electrodes 122 are formed by self-alignment in the positions where the strains have been generated in the semiconductor layer 118 due to the presence of the quantum dots 112.

Conditions for forming the electrodes 122 by the droplet epitaxy method may be as follows. The following conditions are for the case that the semiconductor substrate 110 is a GaAs substrate.

The As partial pressure in the epitaxial growth chamber is set at about $10^{-7}$ Torr, which is ignorable. When In or Ga is deposited as the metal droplets, the substrate temperature is set at, e.g., 100-200° C. When Al is deposited as the metal droplets, the substrate temperature is set at, e.g., 300-400° C. The deposition rate is set at, e.g., 0.5-3 atomic layers (monolayers)/second, and the total deposition amount is set at, e.g., 1-4 atomic layers.

The electrodes 122 can be set at a prescribed size corresponding to the size of the quantum dots 112 by suitably setting conditions, such as the deposition amount, etc., for depositing the metal droplets.

Here, the mechanism for the metal particle-shaped electrodes 122 thus formed by the droplet epitaxy method being formed accurately on the surface of the semiconductor layer 118 in the positions above the quantum dots 112 will be explained.

Generally in the droplet epitaxy method described above, it is known that the positions where the metal droplets are deposited on the surface depend on a surface free energy distribution of the surface for the metal droplets to be deposited on during the droplet epitaxy process.

For example, when the surface is homogeneously processed, the metal droplets are deposited on the surface at random.

In contrast to this, when the surface state is locally modified, the metal droplets are deposited in regions where the surface state is intentionally modified. When the surface state is locally modified, for example, the surface is locally passivated, impurities are locally deposited, the surface is locally patterned, or electric field are locally applied (see, e.g., the specification of U.S. Pat. No. 6,383,286, the specification of U.S. Pat. No. 6,242,326, the specification of U.S. Pat. No. 6,033,972, Japanese published unexamined patent application No. Hei 04-245620 (1992), Japanese published unexamined patent application No. 2000-315654, etc.).

In the method for fabricating the quantum semiconductor device according to the present embodiment, the semiconductor layer 118 is formed thin on the quantum dot layer 114. Accordingly, strains are generated in the semiconductor layer 118 on the respective quantum dots 112.

The parts of the surface of the semiconductor layer 118 where the strains are generated have higher surface energy than the part where the strains are not generated. Accordingly, the metal droplets by the droplet epitaxy method are deposited selectively on the surface of the semiconductor layer 118 in the positions above the quantum dots 112, where the strains are generated.

It is for the following reason that, as described above, the semiconductor layer 118 is formed as thin as possible. That is, when the semiconductor layer 118 is formed thick in comparison with the height of the quantum dots 112, sufficient strains are not generated up to the surface of the semiconductor layer 118. Accordingly, the surface energy at the parts of the surface of the semiconductor layer 118, which are above the quantum dots 112 is not largely changed from that of the rest part, which makes difficult to selectively form the metal droplets.

Thus, by the droplet epitaxy method, the metal particle-shaped electrodes 122 are formed by self-alignment on the surface of the semiconductor layer 118 accurately in the positions above the respective quantum dots 112.

Thus, the quantum semiconductor device according to the present embodiment is fabricated.

As described above, according to the present embodiment, the metal particle-shaped electrodes 122 can be formed accurately above the respective quantum dots 122 by the droplet epitaxy method due to the strains generated in the semiconductor layer 118 on the quantum dots 112. This makes the quantum dots 112 electrically accessible with precision. Furthermore, the respective quantum dots 112 can be made electrically accessible independently of each other.

(A Modification)

Figure 11:
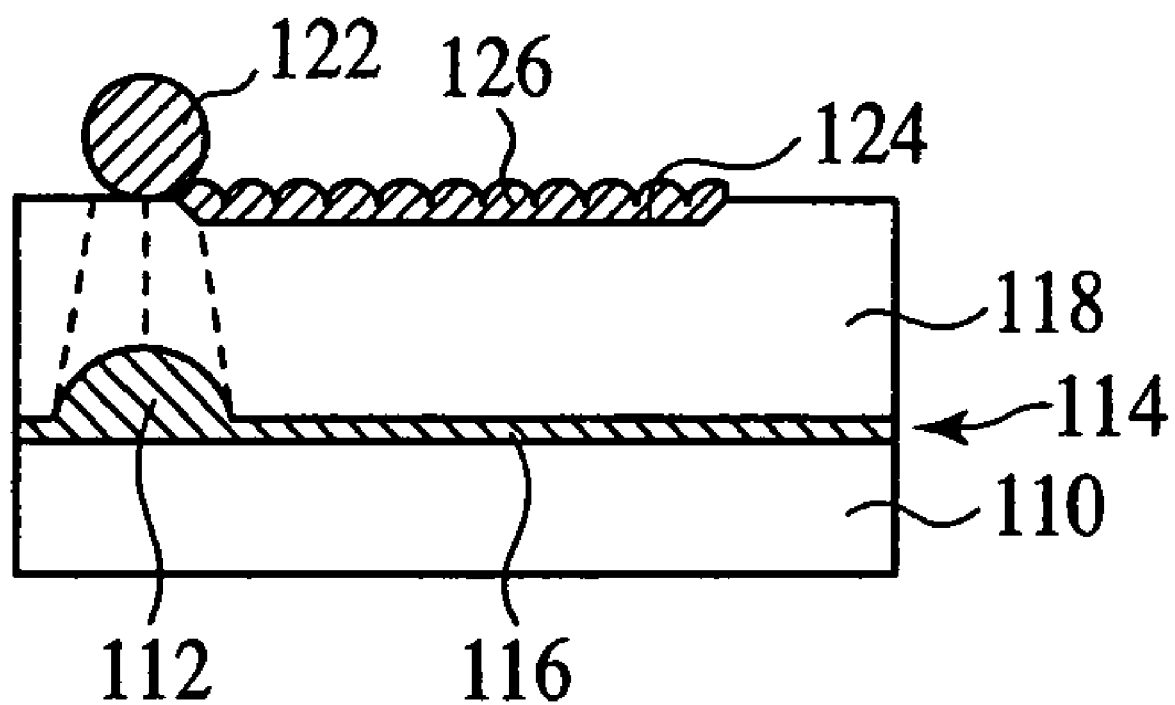
FIG. 11 is a sectional view of the quantum semiconductor device according to a modification of the second embodiment of the present invention, which illustrates a structure thereof.
Figure 12A:
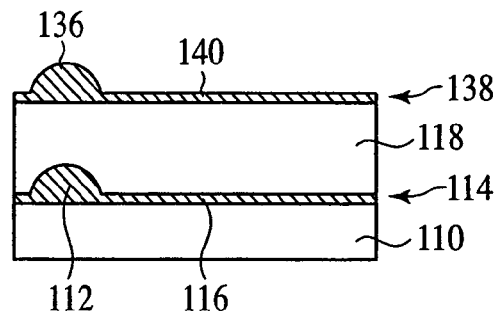
FIG. 12 is sectional views of the quantum semiconductor device according to the modification of the second embodiment of the present invention in the steps of the method for fabricating the quantum semiconductor device, which illustrate the method.
Figure 12B:
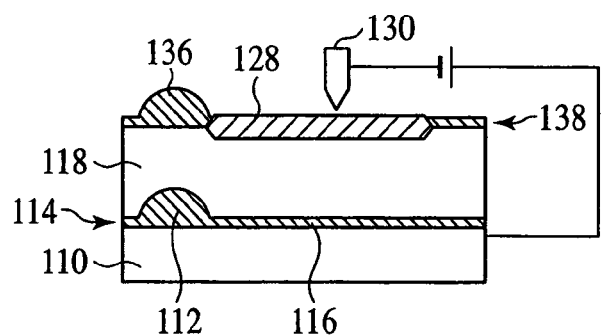
Figure 12C:
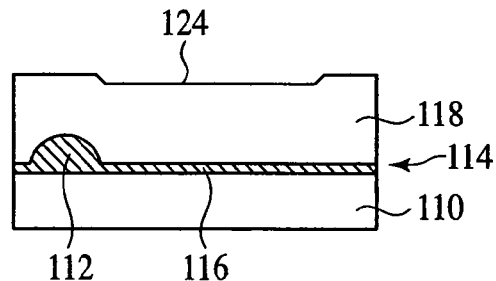
Figure 12D:
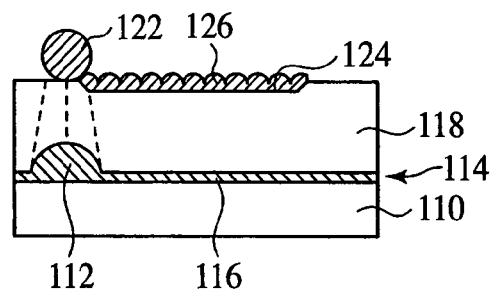
Figure 13:
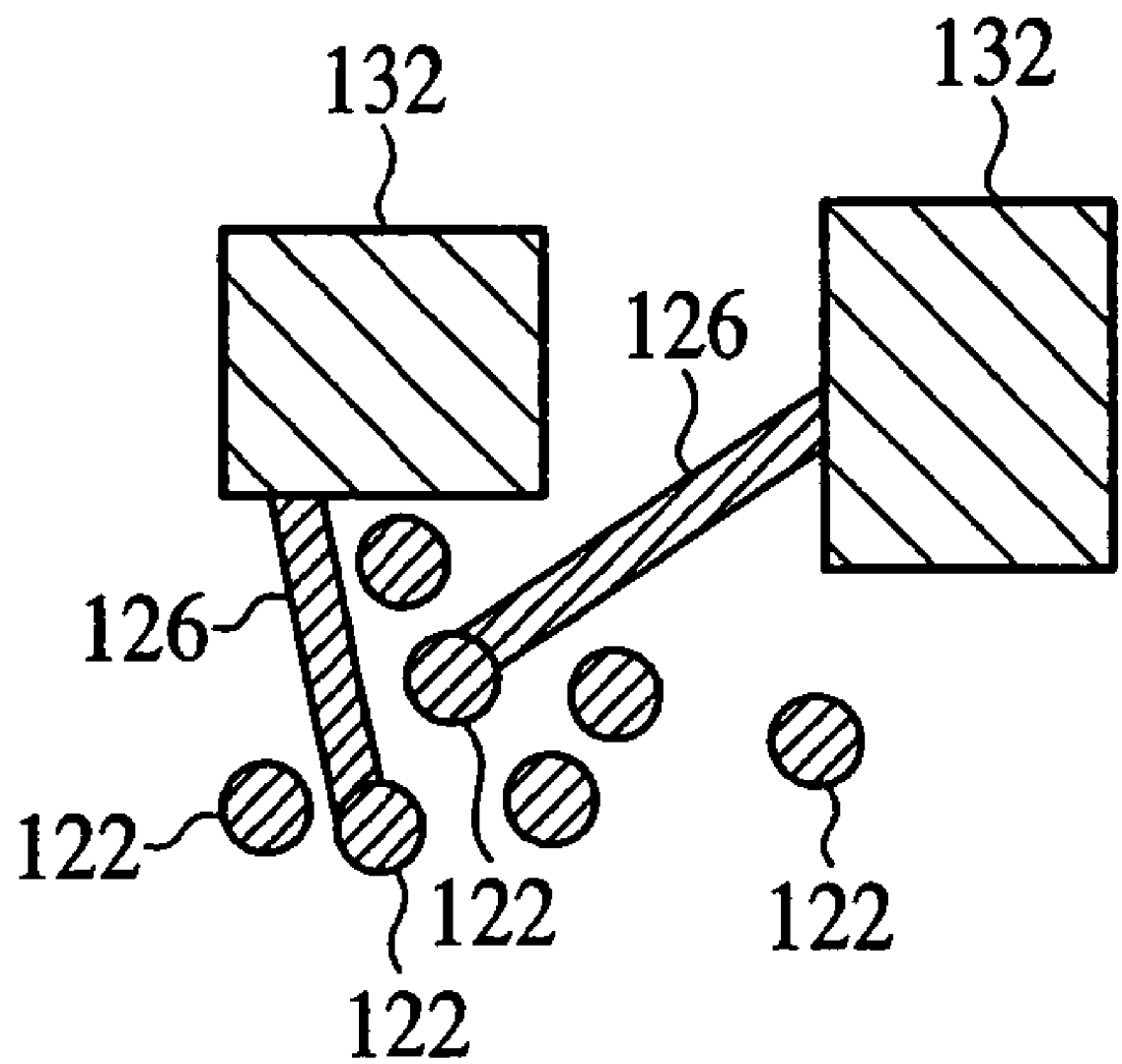
FIG. 13 is an upper side view of the quantum semiconductor device according to the modification of the second embodiment of the present invention with the interconnections connected to the electrode pads.

Next, the quantum semiconductor device according to one modification of the present embodiment and the method for fabricating the quantum semiconductor device will be explained with reference to FIGS. 11 to 13. FIG. 11 is a sectional view of the quantum semiconductor device according to the present modification, which illustrates a structure thereof. FIG. 12 is sectional views of the quantum semiconductor device according to the present modification in the steps of the method for fabricating the quantum semiconductor device, which illustrate the method. FIG. 13 is an upper side view of interconnections connected to electrode pads.

First, the structure of the quantum semiconductor device according to the present modification will be explained with reference to FIG. 11.

The quantum semiconductor device according to the present modification is characterized mainly in that the quantum semiconductor device comprises the electrode 122, and interconnection 126 electrically connected to the electrode 122.

As illustrated in FIG. 11, a trench 124 is formed in the surface of the semiconductor layer 118. The trench 124 has one end located near the electrode 122 formed accurately on the surface of the semiconductor layer 118 in the position above the quantum dot 112.

In the trench 124, the interconnection 126 is formed, electrically connected to the electrode 122.

The quantum semiconductor device according to the present modification includes the interconnection 126 electrically connected to the electrode 122 as described above, which permits the electrode 122 to be electrically connected to peripheral circuits for applying voltages to the quantum dot 112, etc. via the interconnection 126. This more facilitates the electric access to the quantum dots 112.

Next, the method for fabricating the quantum semiconductor device according to the present modification will be explained with reference to FIGS. 12 and 13.

In the same way as illustrated in FIGS. 10A and 10B, the quantum dot layer 114 and the semiconductor layer 118 are sequentially formed.

Next, on the semiconductor layer 118, a semiconductor dot layer 138 is formed by, e.g., MBE. The semiconductor dot layer 138 is epitaxially grown to thereby cause semiconductor dot 136 in the form of a three-dimensionally grown island to be self-assembled by S-K mode (see FIG. 12A). The semiconductor dot layer 138 formed here includes semiconductor dots 136 self-assembled on the semiconductor layer 118, and a wetting layer 140 formed on the semiconductor layer 118 between the semiconductor dots 136. The semiconductor dots 136 may be quantum dots or anti-dots. The semiconductor dot layer 138 is formed of a material whose lattice constant is different from that of the material of the semiconductor layer 118 resultantly for large lattice mismatching. For example, when the quantum dot layer 114 is formed of InGaAs, and the semiconductor layer 118 is formed of GaAs, the semiconductor dot layer 138 can be formed of AlInAs.

As described above, the semiconductor dot 136 of the semiconductor dot layer 138 formed above the quantum dot layer 114 by S-K mode with the semiconductor layer 118 formed therebetween are formed above the quantum dot 112 of the quantum dot layer 114. That is, the position of the quantum dot 112 of the quantum dot layer 114, which is the first layer, and the position of the semiconductor dot 136 of the semiconductor dot layer 138, which is the second layer, are vertically in alignment with each other. The quantum dot 112 and the semiconductor dot 136 are formed thus vertically in alignment with each other, because when a semiconductor dot layer is formed above a quantum dot layer with quantum dots formed on, semiconductor dots, which are quantum dots or anti-dots, tend to be formed in the semiconductor dot layer overlapping with the quantum dots.

Then, the wetting layer 140 of the semiconductor dot layer 138 and the surface layer of the semiconductor layer 118 are oxidized by AFM oxidation to thereby form a line-shaped oxide 128. The line-shaped oxide 128 is formed with one end positioned near the semiconductor dot 136 formed above the quantum dot 112.

AFM oxidation is a method for forming an oxide on the surface of a sample by approaching the AFM probe to the sample and applying a voltage between the AFM probe of the AFM and the sample.

In the present modification, for example, in the atmospheric air of 40-60% humidity, the AFM probe 130 is approaching to the wetting layer 140 of the semiconductor dot layer 138, a negative bias is applied to the probe 130, and a positive bias is applied to the semiconductor substrate 110. With the biases thus being applied, the probe 130 scans the wetting layer 140. The probe 130 scans a line over the surface of the wetting layer 140 where the line-shaped oxide 128 is to be formed. Thus, the wetting layer 140 of the semiconductor layer 138 and the surface layer of the semiconductor layer 118 scanned by the probe 130 are oxidized to hereby form the line-shaped oxide 128 (see FIG. 12B).

Next, the semiconductor dot 136 and the wetting layer 140 of the semiconductor layer 138, and the line-shaped oxide 128 are removed by etching. Thus, the trench 124 are formed in the surface of the semiconductor layer 118 from which the semiconductor dot 136 and the wetting layer 140, and the line-shaped oxide 128 have been removed (see FIG. 12C). For the semiconductor dot layer 138 of, e.g., InAs, HCl is used as the etchant, whereby the semiconductor dot 136 and the wetting layer 140, and the line-shaped oxide 128 can be concurrently removed.

Then, in the same way as described above, metal droplets are deposited on the surface of the semiconductor layer 118 by the droplet epitaxy method. At this time, metal droplets are formed on the surface of the semiconductor layer 118 in the positions where strains have been generated and in the trench 124.

Then, the metal droplets are solidified by cooling following the deposition, and metal particles are formed. Thus, the interconnection 126 in the form of the continuously connected metal particles are formed in the trench 124 together with the formation of the metal particle-shaped electrode 122 (see FIG. 12D).

Thus, the quantum semiconductor device according to the present modification is fabricated.

Hereafter, as illustrated in FIG. 13, the electrode pad 132 electrically connected to the interconnection 126 may be formed.

A Third Embodiment

Figure 14:
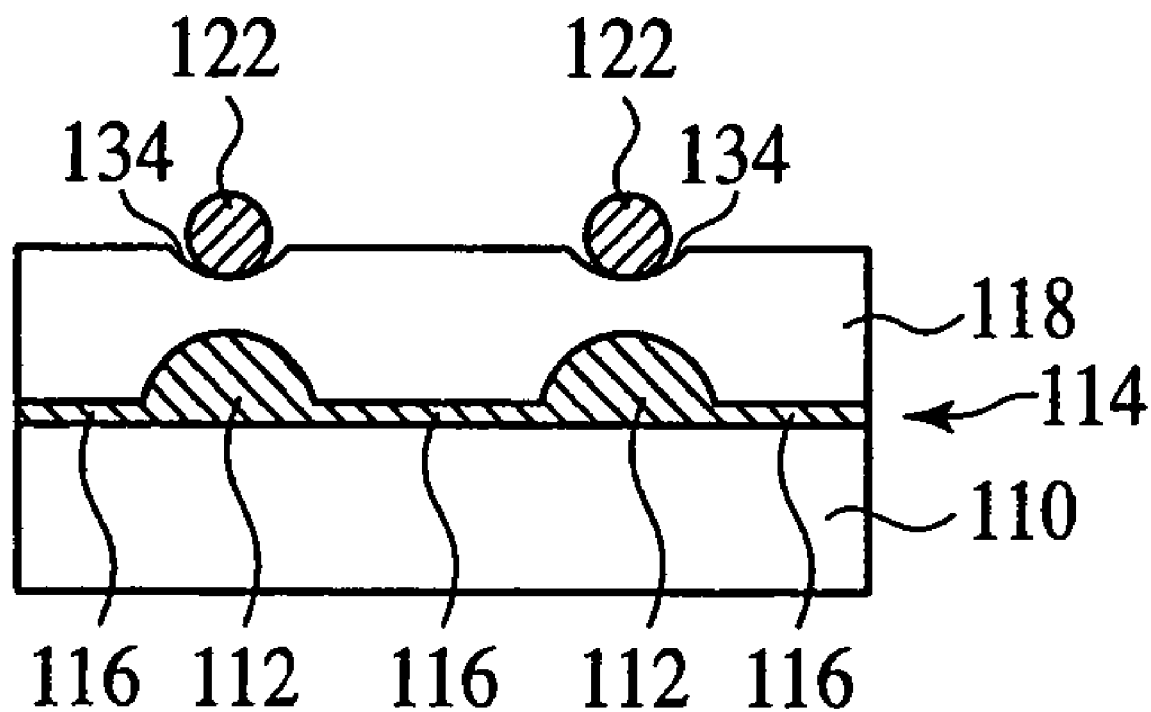
FIG. 14 is a sectional view of the quantum semiconductor device according to a third embodiment of the present invention, which illustrates a structure thereof.

The quantum semiconductor device according to a third embodiment of the present invention and the method for fabricating the quantum semiconductor device will be explained with reference to FIGS. 14 and 15. FIG. 14 is a sectional view of the quantum semiconductor device according to the present embodiment, which illustrates a structure thereof. FIG. 15 is sectional views of the quantum semiconductor device according to the present embodiment in the steps of the method for fabricating the semiconductor device, which illustrate the method. The same members of the present embodiment as those of the quantum semiconductor device according to the second embodiment and the method for fabricating the quantum semiconductor device are represented by the same reference numbers not to repeat or to simplify their explanation.

First, the structure of the quantum semiconductor device according to the present embodiment will be explained with reference to FIG. 14.

A quantum dot layer 114 of a semiconductor, including self-assembled quantum dots 112 is formed on a semiconductor substrate 110.

A semiconductor layer 118 is formed on the quantum dot layer 114.

Concavities 134 are formed in the surface of the semiconductor layer 118 in the positions above the quantum dots 112. Metal particle-shaped electrodes 122 are formed in the concavities 134.

The quantum semiconductor device according to the present embodiment is characterized mainly in that the electrodes 122 are formed in the concavities 134 formed in the surface of the semiconductor layer 118 in the positions above the quantum dots 112.

As described above, because of the concavities formed in the surface of the semiconductor layer 118 in the positions above the quantum dots 112, the electrodes 122 are formed accurately above the respective quantum dots 112, whereby the quantum dots 112 can be made electrically accessible with precision via such electrodes 122. Furthermore, the respective quantum dots 112, which have been self-assembled, can be made electrically accessible independently of each other.

The energy band structure of the quantum semiconductor device according to the present embodiment is substantially the same as that of the quantum semiconductor device according to the second embodiment illustrated in FIG. 9.

Next, the method for fabricating the quantum semiconductor device according to the present embodiment will be explained with reference to FIG. 15.

Figure 15A:
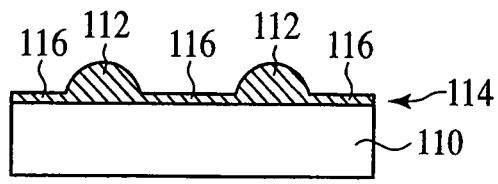
FIG. 15 is sectional views of the quantum semiconductor device according to the third embodiment of the present invention in the steps of the method for fabricating the quantum semiconductor device, which illustrate the method.
Figure 15B:
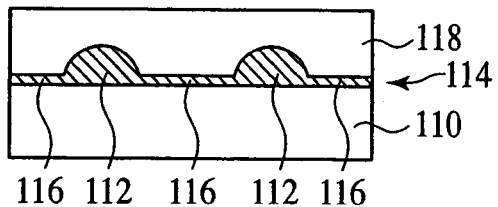
Figure 15C:
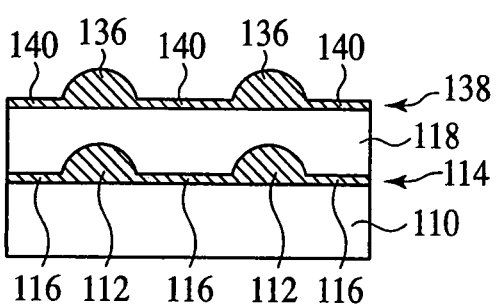
Figure 15D:
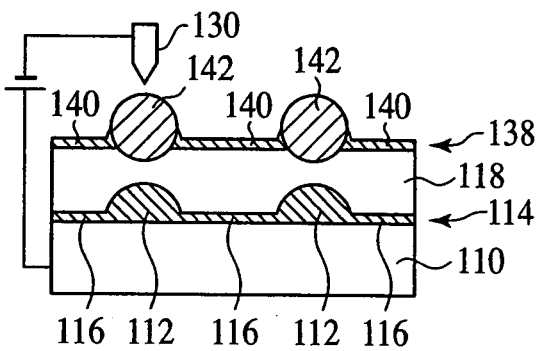

First, in the same way as in the second embodiment, the quantum dot layer 114 including the quantum dots 112, and the semiconductor layer 118 are sequentially formed on the semiconductor substrate 110 (see FIGS. 15A and 16B).

Then, the semiconductor dot layer 138 is formed on the semiconductor layer 118 by, e.g., MBE. The semiconductor dot layer 138 is epitaxially grown to thereby cause the semiconductor dots 136 in the shape of a three-dimensionally grown island to be self-assembled by S-K mode (see FIG. 15C). The semiconductor dot layer 138 formed here includes the semiconductor dots 136 self-assembled on the semiconductor layer 118, and the wetting layer 140 formed on the semiconductor layer 118 between the semiconductor dots 136. The semiconductor dots 136 may be quantum dots or anti-dots. The semiconductor dot layer 138 is formed of a material whose lattice constant is different from that of the material of the semiconductor layer 118 resultantly for large lattice-mismatching. For example, when the quantum dot layer 114 is formed of InGaAs, and the semiconductor layer 118 is formed of GaAs, the semiconductor dot layer 138 can be formed of AlInAs.

As described above, the semiconductor dots 136 of the semiconductor dot layer 138 formed on the quantum dot layer 114 laid on the quantum dot layer 114 by S-K mode via the semiconductor layer 118 formed therebetween is formed above the quantum dots 112 of the quantum dot layer 114. That is, the positions of the quantum dots 112 of the quantum dot layer 114, which is the first layer, and the positions of the semiconductor dots 136 of the semiconductor dot layer 138, which is the second layer, are in vertical alignment with each other. The quantum dots 112 and the semiconductor dots 136 are formed, thus overlapping each other, because when a semiconductor dot layer is formed on a quantum dot layer with quantum dots formed in, semiconductor dots which are quantum dots or anti-dots tend to be formed in the semiconductor dot layer, overlapping the quantum dots.

Next, by AFM oxidation, the semiconductor dots 136 and the semiconductor layer 118 immediately below the semiconductor dots 136 are oxidized. For example, in the atmospheric air of 40-60% humidity with the AFM probe 130 approximated to the semiconductor dot 136, a negative bias is applied to the probe 130, and a positive bias is applied to the semiconductor substrate 110, for a prescribed period of time (see FIG. 15D). For example, when the semiconductor dots 136 are formed of InGaAs, an about 3-10 V voltage is applied. Thus, a dot-shaped oxide 142 produced by the semiconductor dot 136 and the semiconductor layer 118 immediately below the semiconductor dot 136 being oxidized is formed. Thus, the dot-shaped oxides 142 are formed, partially buried in the surface layer of the semiconductor layer 118.

It is preferable that the semiconductor dots 136 are formed small so as to facilitate the above-described oxidation. For example, preferably, the semiconductor dots 136 are formed in an about 15-30 nm-size.

Next, the dot-shaped oxides 142 are etched off. The etchant is diluted HCl, or diluted $NH_4OH$ or others in etching off the dot-shaped oxides 142 which are formed by oxidizing the semiconductor dots 136 of, e.g., InGaAs.

Together with the removal of the dot-shaped oxides 142 by the etching, the wetting layer 140 is also etched off. The dot-shaped oxides 142 or the wetting layer 140 may be removed first. The dot-shaped oxides 142 and the wetting layer 140 may be removed simultaneously by selecting a suitable etchant. For example, by using HCl as the etchant, the dot-shaped oxides 142 containing As and the wetting layer 140 of InAs can be simultaneously removed.

Figure 15E:
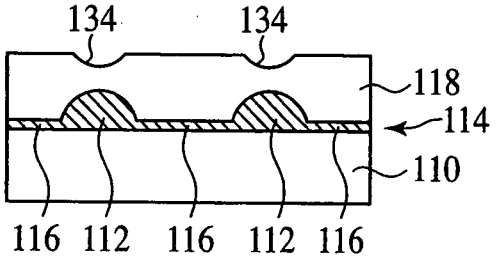
Figure 15F:
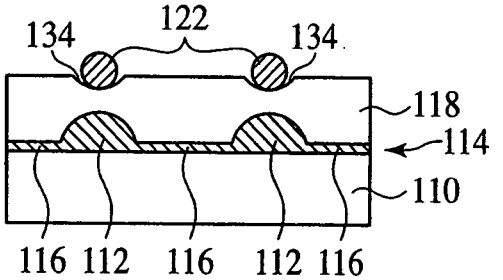

The dot-shaped oxides 142 are thus removed, whereby the concavities 134 are formed in the surface of the semiconductor layer 118 in the positions where the semiconductor dots 136 have been formed, i.e., in the positions above the respective quantum dots 112 buried in the semiconductor layer 118 (see FIG. 15E).

In a case that the semiconductor dots 136 are not low enough to completely oxidize the semiconductor dots 136 once by AFM oxidation or in other cases, the concavities 134 may be formed in the surface of the semiconductor layer 118 as follows. That is, the concavities 134 may be formed in the surface of the semiconductor layer 118 by repeating the step of oxidizing a part of the upper end of the semiconductor dot 136 by AFM oxidation and the step of etching off the oxidized part of the semiconductor dots 136.

Next, in the same way as in the second embodiment, metal droplets are deposited by the droplet epitaxy method on the surface of the semiconductor layer 118 with the concavities 134 formed in.

At this time, the metal droplets deposited on the surface of the semiconductor layer 118 moves to the concavities 134 formed in the surface of the semiconductor layer 118.

Then, the metal droplets is solidified by cooling after the deposition, and the metal particles are formed. Thus, the metal particle-shaped electrodes 122 are formed in the concavities 134 (see FIG. 15F).

In the method for fabricating the quantum semiconductor device according to the present embodiment, even when sufficient strains are not generated in the semiconductor layer 118 on the quantum dots 112, the concavities 134 are formed in positions above the quantum dots 112 in the surface of the semiconductor layer 118 as described above, whereby the electrodes 122 can be formed accurately above the quantum dots 112. Cases that sufficient strains are not generated in the semiconductor layer 118 on the quantum dots 112 are, e.g., the small lattice mismatching between the quantum dots 112 and the layer 118, and the thickness of the semiconductor layer 118 is not so thin as, e.g., 10 nm.

It is preferable that the semiconductor dots 136 are completely oxidized to form the dot-shaped oxides 142 so that no convexities remain around the concavities 134 so that the metal droplets deposited by the droplet epitaxy method can smoothly move to the concavities 134. For the same reason, preferably, in etching off the wetting layer 140, the wetting layer 140 is sufficiently etched off so that no convexities of residues of the wetting layer 140 are formed around the concavities 134.

Thus, the quantum semiconductor device according to the present embodiment is fabricated.

As described above, according to the present embodiment, the concavities 134 are formed in the surface of the semiconductor layer 118 above the quantum dots 112 by etching off the dot-shaped oxide 142 which are formed by oxidizing the semiconductor dots 136 formed above the quantum dots 112, and the metal particle-shaped electrodes 122 are formed by the droplet epitaxy method, whereby the electrodes 122 can be formed accurately above the respective quantum dots 112. Thus, the quantum dots 112 can be accurately electrically accessible. The quantum dots 112 can be made electrically accessible independently of each other.

(A Modification)

Figure 16:
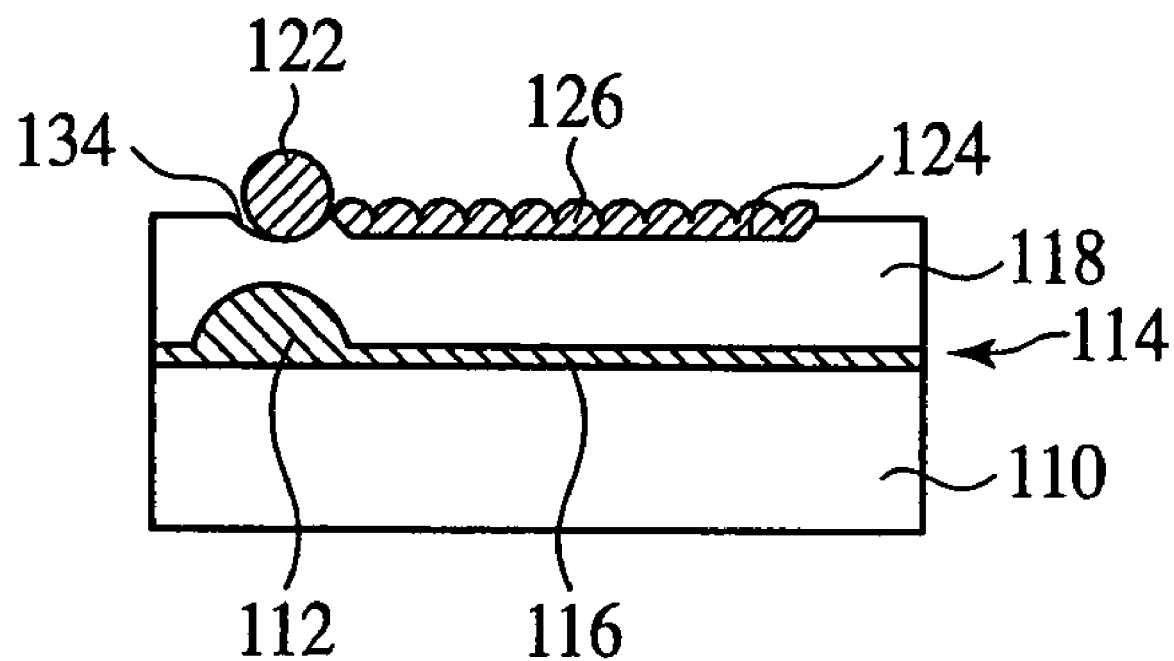
FIG. 16 is a sectional view of the quantum semiconductor device according to a modification of the third embodiment of the present invention, which illustrates a structure thereof.

Next, the quantum semiconductor device according to one modification of the present embodiment and the method for fabricating the quantum semiconductor device will be explained with reference to FIGS. 16 and 17. FIG. 16 is a sectional view of the quantum semiconductor device according to the present modification, which illustrates a structure thereof. FIG. 17 is sectional views of the quantum semiconductor device according to the present modification in the steps of the method for fabricating the quantum semiconductor device, which illustrate the method.

First, the structure of the quantum semiconductor device according to the present modification will be explained with reference to FIG. 16.

As is the quantum semiconductor device according to the modification of the second embodiment, the quantum semiconductor device according to the present modification is characterized mainly in that the electrode 122 and the interconnection 126 electrically connected to the electrode 122 are formed.

As illustrated in FIG. 16, the trench 124 is formed in the surface of the semiconductor layer 118. The trench 124 has one end located near the concavity 134 formed in the surface of the semiconductor layer 118 accurately in the position above the quantum dot 112.

In the trench 124, interconnection 126 is formed, electrically connected to the electrode 122.

As described above, the quantum semiconductor device according to the present modification includes the interconnection 126 electrically connected to the electrode 122, whereby peripheral circuits for applying voltages to the quantum dot 112, etc. can be electrically connected to the electrode 122 via the interconnection 126.

Then, the method for fabricating the quantum semiconductor device according to the present modification will be explained with reference to FIG. 17.

Figure 17A:
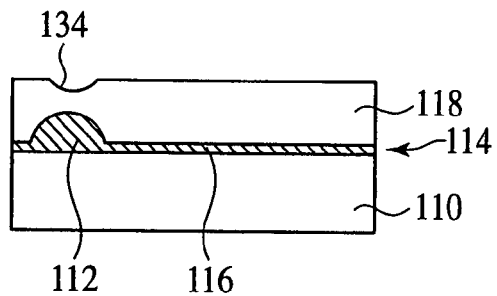
FIG. 17 is sectional views of the quantum semiconductor device according to the modification of the third embodiment of the present invention in the steps of the method for fabricating the quantum semiconductor device, which illustrate the method.
Figure 17B:
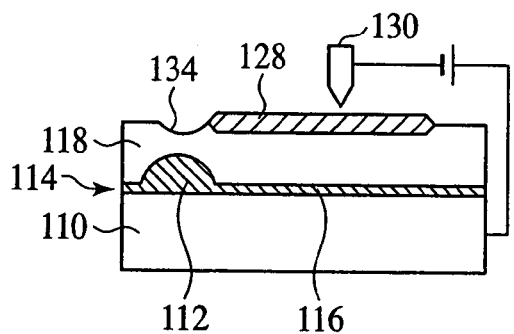
Figure 17C:
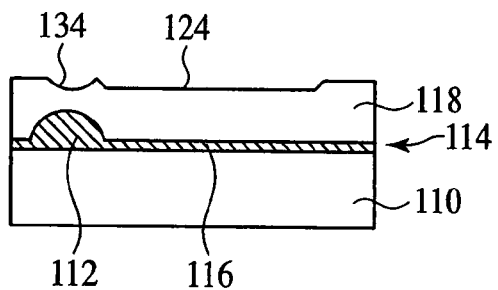
Figure 17D:
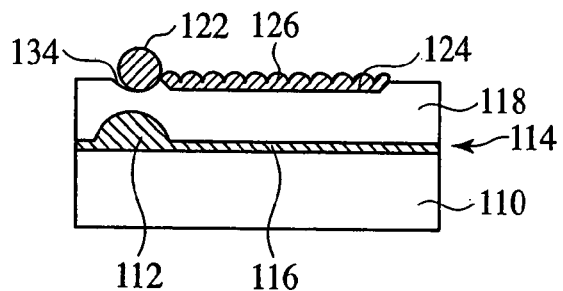

The same as illustrated in FIGS. 15A to 15E, the concavity 134 is formed in the surface of the semiconductor layer 118 above the quantum dot 112 (see FIG. 17A).

Next, a line-shaped oxide 128 is formed on the surface of the semiconductor layer 118 by AFM oxidation. The line-shaped oxide 128 is formed with one end thereof located in the position of the concavity 134 in the surface of the semiconductor layer 118 (see FIG. 17B).

Next, the line-shaped oxide 128 formed on the surface of the semiconductor layer 118 is etched off. Thus, the trench 124 is formed in the surface of the semiconductor layer 118 in the position where the line-shaped oxide 128 has been removed (see FIG. 17C).

Then, in the same way as described above, metal droplets are deposited on the surface of the semiconductor layer 118 by the droplet epitaxy method. At this time, the metal droplets are formed in the concavity 134 in the surface of the semiconductor layer 118 and in the trench 124.

Then, the metal droplets are solidified by cooling after the deposition, and the metal particles are formed. Thus, the interconnection 126 in the form of metal particles formed continuous in the trench 124 is formed together with the formation of the metal particle-shaped electrode 122 (see FIG. 17D).

Thus, the quantum semiconductor device according to the present modification is fabricated.

Following this, the electrode pad 132 may be formed, electrically connected to the interconnection 126 in the same way as in the modification of the second embodiment.

A Fourth Embodiment

Figure 18:
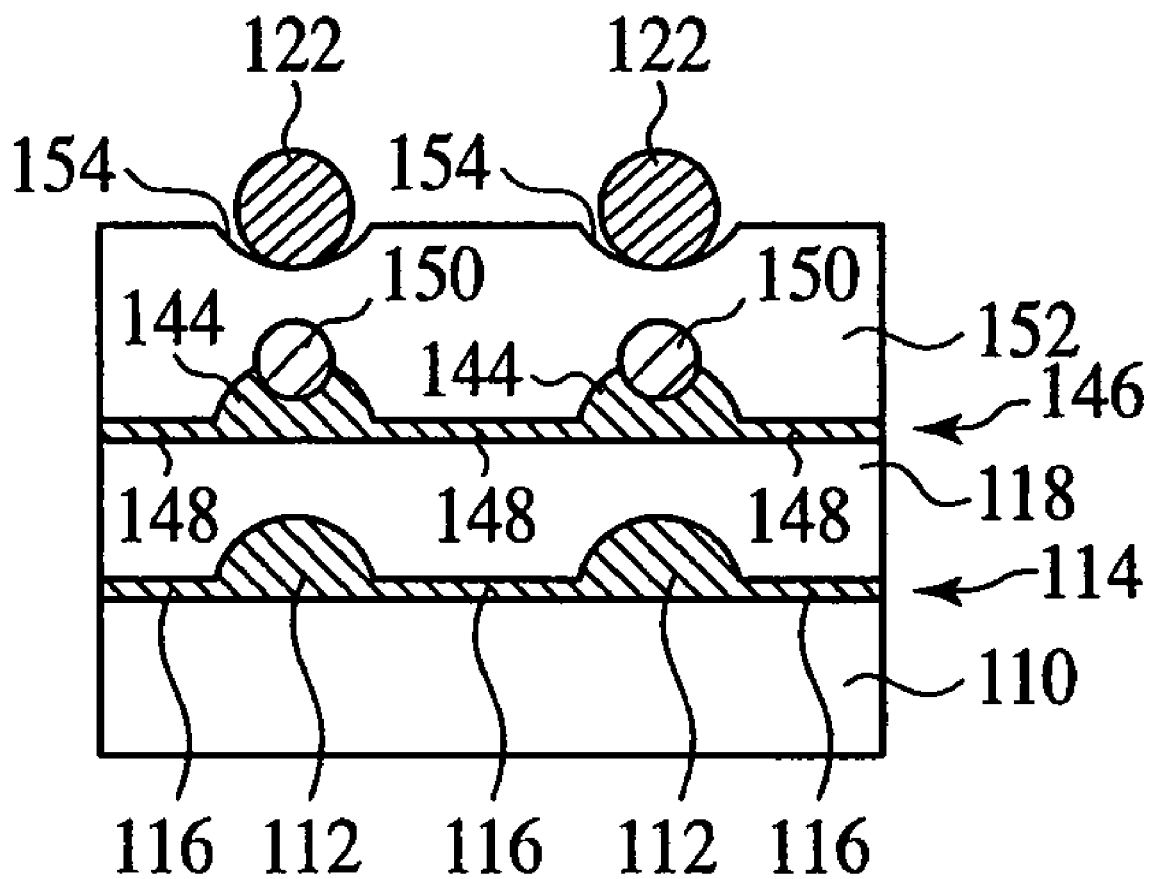
FIG. 18 is a sectional view of the quantum semiconductor device according to a fourth embodiment of the present invention, which illustrates a structure thereof.
Figure 19:
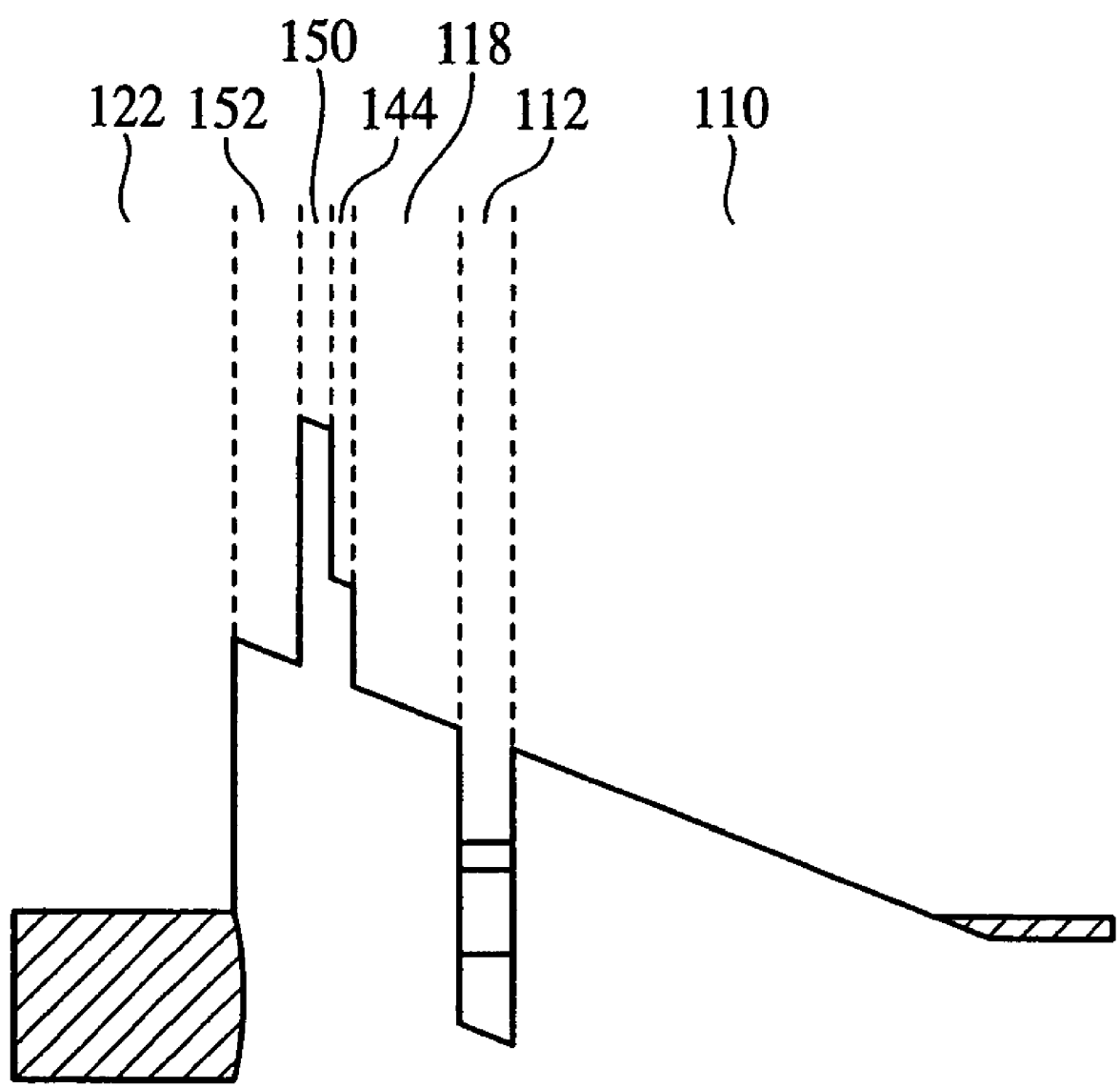
FIG. 19 is a view of an energy band structure of the quantum semiconductor device according to the fourth embodiment of the present invention.

The quantum semiconductor device according to a fourth embodiment of the present invention and the method for fabricating the quantum semiconductor device will be explained with reference to FIGS. 18 to 20. FIG. 18 is a sectional view of the quantum semiconductor device according to the present embodiment, which illustrates a structure thereof. FIG. 19 is a view of the band energy of the quantum semiconductor device according to the present embodiment. FIG. 20 is sectional views of the quantum semiconductor device according to the present embodiment in the steps of the method for fabricating the quantum semiconductor device, which illustrate the method. The same members of the present embodiment as those of the quantum semiconductor device according to the second and the third embodiment and the method for fabricating the quantum semiconductor device are represented by the same reference numbers not to repeat or to simplify their explanation.

First, the structure of the quantum semiconductor device according to the present embodiment will be explained with reference to FIG. 18.

A quantum dot layer 114 of a semiconductor, which includes self-assembled quantum dots 112 is formed on a semiconductor substrate 110.

An intermediate layer, i.e., a semiconductor layer 118 is formed on the quantum dot layer 114.

On the semiconductor layer 118, a semiconductor dot layer 146 of a semiconductor, which includes self-assembled semiconductor dots 144 is formed. The semiconductor dot layer 146 includes the semiconductor dots 144 self-assembled on the semiconductor layer 118 and a wetting layer 148 formed on the semiconductor layer 118 between the semiconductor dots 144. The semiconductor dots 144 of the semiconductor dot layer 146 are formed on the quantum dot layer 114 in the positions above the quantum dots 112. The semiconductor dots 144 can be anti-dots or quantum dots.

Dot-shaped oxides 150 are formed on the upper ends of the semiconductor dots 144 of the semiconductor dot layer 146 by oxidizing the semiconductor dots 144 partially at the upper ends.

A cap layer, i.e., a semiconductor layer 152 is formed on the semiconductor dot layer 146 including the semiconductor dots 144 having the dot-shaped oxides 150 formed at the upper ends.

Concavities 154 are formed in the surface of the semiconductor layer 152 in the positions above the quantum dots 112 and the semiconductor dots 144 laid the latter above the former. Metal particle-shaped electrodes 122 are formed in the concavities 154.

The quantum semiconductor device according to the present embodiment is characterized mainly in that the electrodes 122 are formed in the concavities 154 formed in the surface of the semiconductor layer 152 in the positions above the quantum dots 112 and the semiconductor dots 144 laid the latter above the former, i.e., the electrodes 122 are formed accurately above the respective quantum dots 112.

Thus, because of the concavities 154 formed in the surface of the semiconductor layer 152 in the positions above the quantum dots 112, the electrodes 122 are formed accurately above the respective quantum dots 112, whereby the quantum dots 112, which have been self-assembled, can be made accurately electrically accessible via the electrodes 122. The respective quantum dots 112, which have been self-assembled, can be made electrically accessible independently of each other.

The quantum semiconductor device according to the present embodiment is also characterized in that the semiconductor layer 152 in addition to the semiconductor layer 118 is formed between the quantum dots 112 and the electrodes 122. Because of the semiconductor layer 152 in addition to the semiconductor layer 118, the metal of the electrodes 122 can be prevented from being diffused to intrude into the quantum dots 112 in thermal processing, etc.

The energy band structure of the quantum semiconductor device according to the present embodiment is as illustrated in FIG. 19.

The height and width of the barrier between the quantum dot 112 and the electrode 122 shown in the energy band structure illustrated in FIG. 19 can be set at prescribed values by suitably setting the material compositions and thicknesses of the semiconductor layers 118, 152, the material composition and size of the semiconductor dot 144, the size of the dot-shaped oxide 150, etc.

Next, the method for fabricating the quantum semiconductor device according to the present embodiment will be explained with reference to FIG. 20.

Figure 20A:
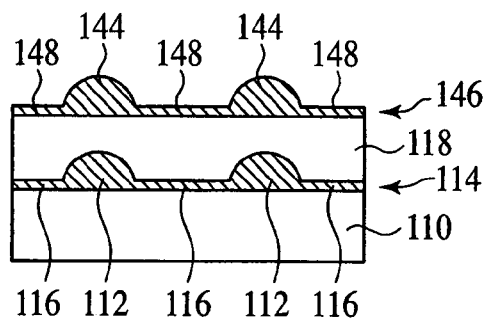
FIG. 20 is sectional views of the quantum semiconductor device according to the fourth embodiment of the present invention in the steps of the method for fabricating the quantum semiconductor device, which illustrate the method.

First, in the same way as in the third embodiment, the quantum dot layer 114 and the semiconductor dot layer 146 are formed the latter above the former by, e.g., MBE on the semiconductor substrate 110 with the semiconductor layer 118 formed therebetween (see FIG. 20A). The semiconductor dots 144 are formed of a material whose lattice constant is different from that of the material of the semiconductor layer 118 resultantly for large lattice mismatching, and are formed of a material having a higher ground level energy than, e.g., the semiconductor layer 118. In this case, the semiconductor dots 144 are anti-dots. The semiconductor dots 144 are formed of such material, whereby the influence of the semiconductor dots 144 on the buried quantum dots 112 can be reduced. The semiconductor dots 144 are formed of, e.g., InAlAs, InGaAlAs or others.

The semiconductor dots 144 are different from the semiconductor dots 136 of the second layer formed in the method for fabricating the quantum semiconductor device according to the third embodiment and are not formed essentially small.

As described above, the semiconductor dots 144 of the semiconductor dot layer 146 laid by S-K mode on the quantum dot layer 114 with the semiconductor layer 118 formed therebetween are formed above the quantum dots 112 of the quantum dot layer 114, as in the third embodiment.

Then, the semiconductor substrate 110 is unloaded out of the epitaxial growth chamber.

Subsequently, the upper ends of the semiconductor dots 144 of the semiconductor layer 146 are partially oxidized by AFM oxidation. For example, in the atmospheric air of 40-60% humidity, with the probe 130 approached to the semiconductor dot 144, a negative bias is applied to the probe 130, and a positive bias is applied to the semiconductor substrate 110, for a prescribed period of time. Thus, the upper ends of the semiconductor dots 144 are partially oxidized, and the dot-shaped oxides 150 are formed (see FIG. 20B).

Then, contaminants adsorbed on the surface and a natural oxide film, etc. formed on the surface are removed, and the semiconductor substrate 110 is again loaded into the epitaxial growth chamber of the film deposition apparatus. For the removal of the contaminants, etc. the cleaning method using, e.g., atom hydrogen irradiation can be used.

Then, the semiconductor layer 152 is formed on the semiconductor dot layer 146 by, e.g., MBE. The semiconductor layer 152 is formed of, e.g., the same material as the semiconductor dots 144 or is formed of a material having a larger energy gap than the material of the semiconductor dots 144.

In the growth of the semiconductor layer 152, the growth rate of the semiconductor layer 152 on the dot-shaped oxides 150, which is non-crystalline, is lower than the growth rate of the semiconductor layer 152 in the rest region. Resultantly, the concavities 154 are formed in the surface of the semiconductor layer 152 above the dot-shaped oxides 150 (see FIG. 20C).

Thus, the concavities 154 are formed in the surface of the semiconductor layer 152 in the positions above the quantum dots 112 and the semiconductor dots 144 laid the latter above the former.

Next, metal droplets are deposited by the droplet epitaxy method on the surface of the semiconductor layer 152 with the concavities 154 formed. As in the third embodiments, the metal droplets deposited on the surface of the semiconductor layer 152 move to the concavities 154, as in the third embodiment.

Subsequently, the metal droplets are solidified by cooling after the deposition, and the metal particles are formed. Thus, the metal particle-shaped electrodes 122 are formed in the concavities 44 in the surface of the semiconductor layer 152 (see FIG. 20D).

Thus, the quantum semiconductor device according to the present embodiment is fabricated.

As described above, according to the present embodiment, the growth rate of the semiconductor layer 152 being lower on the oxide dots 150 formed by partially oxidizing the semiconductor dots 144 at the upper ends laid above the quantum dots 112 is used to form the concavities 154 in the surface of the semiconductor layer 152 in the positions above the quantum dots 112 and the metal particle-shaped electrodes 122 are formed by the droplet epitaxy method, whereby the electrodes 122 can be formed in the positions accurately above the respective quantum dots 112. Thus, the quantum dots 112 can be made accurately electrically accessible. The quantum dots 112 can be made electrically accessible independently of each other.

(A Modification)

Figure 21:
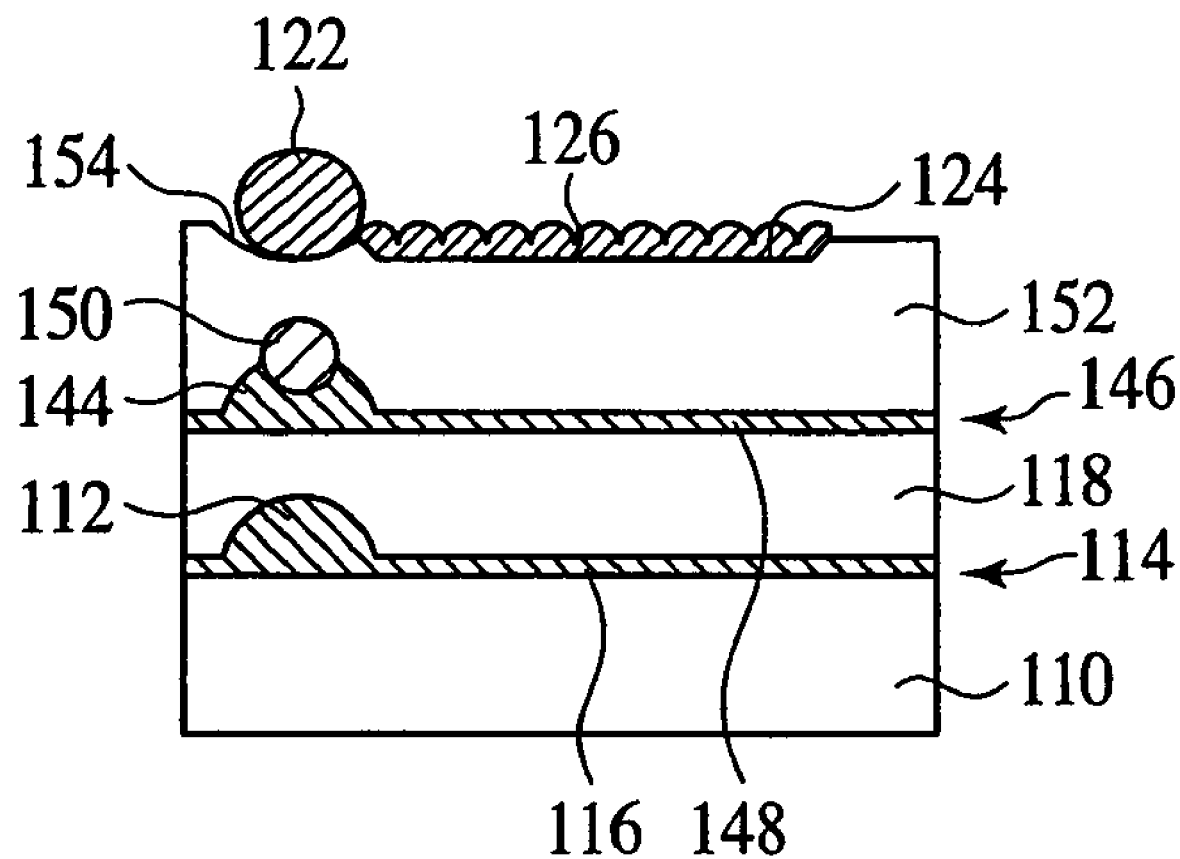
FIG. 21 is a sectional view of the quantum semiconductor device according to a modification of the fourth embodiment of the present invention, which illustrates a structure thereof.

Next, the quantum semiconductor device according to a modification of the present embodiment and the method for fabricating the quantum semiconductor device will be explained with reference to FIGS. 21 and 22. FIG. 21 is a sectional view of the quantum semiconductor device according to the present modification, which illustrate a structure thereof. FIG. 22 are sectional views of the quantum semiconductor device according to the present modification in the steps of the method for fabricating the quantum semiconductor device, which illustrate the method.

First, the structure of the quantum semiconductor device according to the present modification will be explained with reference to FIG. 21.

The quantum semiconductor device according to the present modification is characterized mainly in that, as in the quantum semiconductor device according to the modification of the second and the third embodiments, the quantum semiconductor device includes the electrode 122 and the interconnection 126 electrically connected to the electrode 122.

As illustrated in FIG. 21, the trench 124 is formed in the surface of the semiconductor layer 152. The trench 124 has one end located near the concavity 154 formed in the surface of the semiconductor layer 152 in the position accurately above the quantum dot 112.

In the trench 124, the interconnection 126 is formed, electrically connected to the electrode 122.

As described above, the quantum semiconductor device according to the present modification includes the interconnection 126 electrically connected to the electrode 122, whereby peripheral circuits for applying voltages to the quantum dot 112, etc. can be electrically connected to the electrode 122 via the interconnection 126.

Next, the method for fabricating the quantum semiconductor device according to the present modification will be explained with reference to FIG. 22.

Figure 20B:
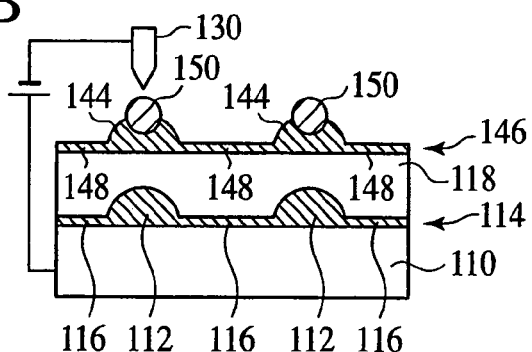
Figure 20C:
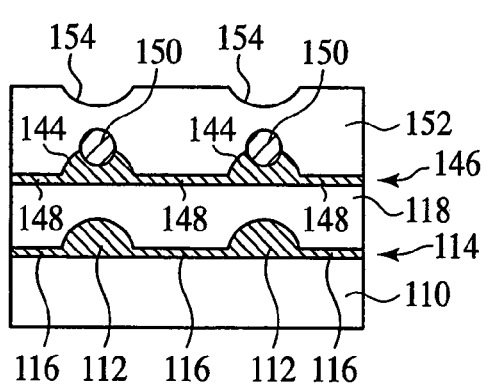
Figure 20D:
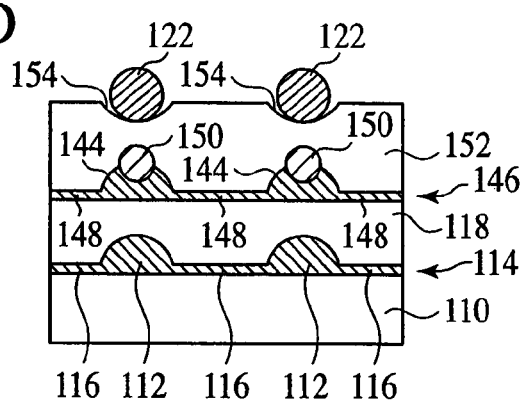
Figure 22A:
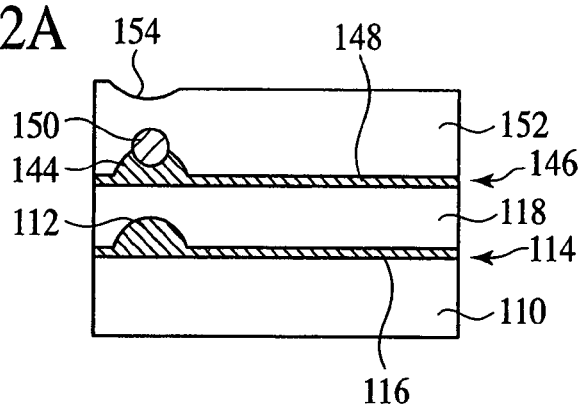
FIG. 22 is sectional views of the quantum semiconductor device according to the modification of the fourth embodiment of the present invention in the steps of the method for fabricating the quantum semiconductor device, which illustrate the method.
Figure 22B:
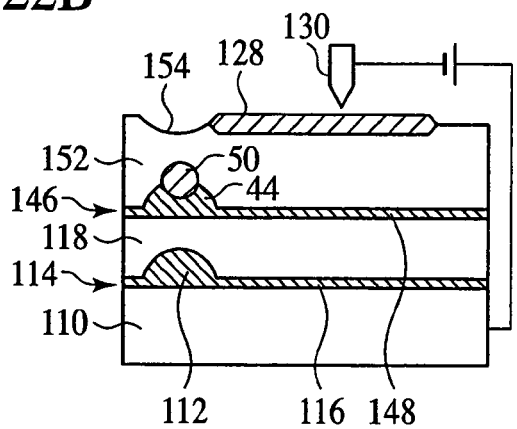
Figure 22C:
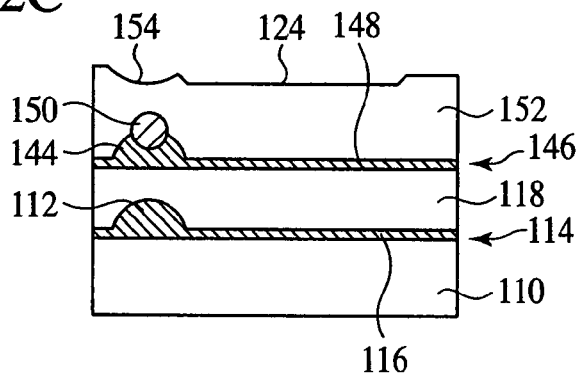
Figure 22D:
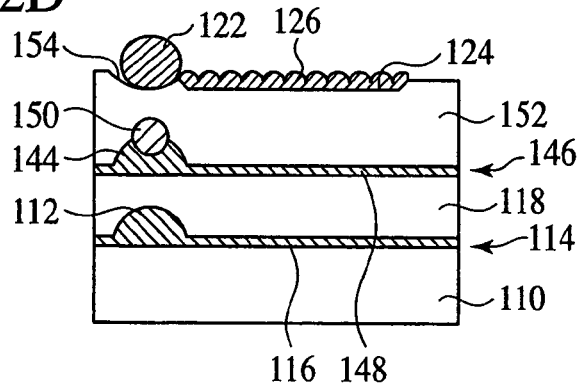

In the same way as illustrated in FIGS. 20A to 20C, the concavity 154 is formed in the surface of the semiconductor layer 152 in the position above the dot-shaped oxide 150 (see FIG. 22A).

Then, a line-shaped oxide 128 is formed on the surface of the semiconductor layer 152 by AFM oxidation. The line-shaped oxide 128 is formed with one end located at the position of the concavity 154 in the surface of the semiconductor layer 152 (see FIG. 22B).

Next, the line-shaped oxide 128 formed on the surface of the semiconductor layer 152 is etched off. Thus, the trench 124 is formed in the surface of the semiconductor layer 152, from which the line-shaped oxide 128 have been removed (see FIG. 22C).

Next, in the same way as described above, metal droplets are deposited on the surface of the semiconductor layer 152 by the droplet epitaxy method. At this time, the metal droplets are formed not only in the concavity 154 in the surface of the semiconductor layer 152, but also in the trench 124.

Subsequently, the metal droplets are solidified by cooling after the deposition, and the metal particles are formed. Thus, the interconnection 126 of the metal particles continuously connected in the trench 124 is formed together with the formation of the metal particle-shaped electrode 122 (see FIG. 22D).

Thus, the quantum semiconductor device according to the present modification is fabricated.

Hereafter, as in the modification of the second embodiment, the electrode pad 132 electrically connected to the interconnection 126 may be formed.

A Fifth Embodiment

Figure 23:
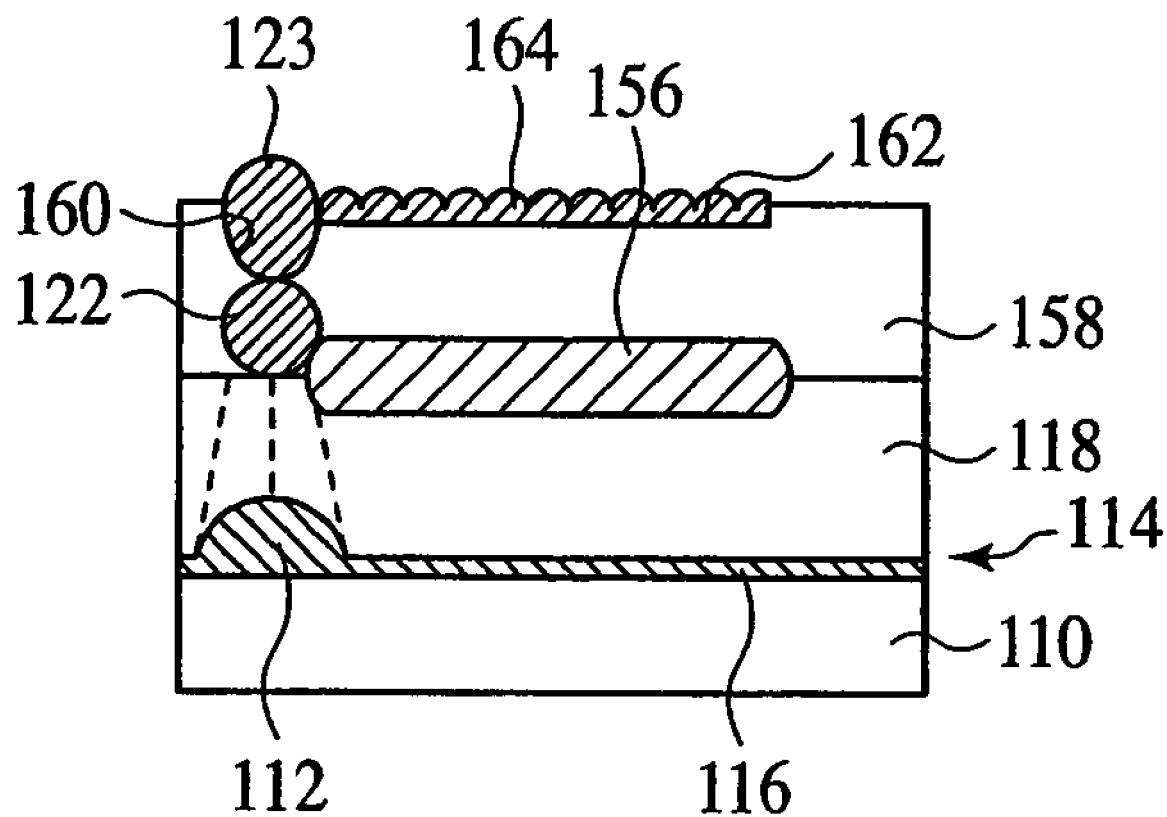
FIG. 23 is a sectional view of the quantum semiconductor device according to a fifth embodiment of the present invention, which illustrates a structure thereof.

The quantum semiconductor device according to a fifth embodiment of the present invention and the method for fabricating the quantum semiconductor device will be explained with reference to FIG. 23 and FIG. 24. FIG. 23 is a sectional view of the quantum semiconductor device according to the present embodiment, which illustrates a structure thereof. FIG. 24 is sectional views of the quantum semiconductor device according to the present embodiment in the steps of the method for fabricating the quantum semiconductor device, which illustrate the method. The same members of the present embodiment as those of the quantum semiconductor device according to the second to the fourth embodiments and the method for fabricating the quantum semiconductor device are represented by the same reference numbers not to repeat or to simplify their explanation.

First, the structure of the quantum semiconductor device according to the present embodiment will be explained with reference to FIG. 23. In the quantum semiconductor device according to the present embodiment as well as the quantum semiconductor device according to the modification of the second embodiment, an interconnection is formed, electrically connected to an electrode.

As illustrated in FIG. 23, a quantum dot layer 114 of a semiconductor, including a self-assembled quantum dot 112 is formed on a semiconductor layer 110.

On the quantum dot layer 16, an intermediate layer, i.e., a semiconductor layer 118 is formed. Strains due to the lattice mismatching are generated in the semiconductor layer 118 on the quantum dot 112.

A metal particle-shaped electrode 122 is formed on the surface of the semiconductor layer 118 in the position where the strains are generated. A line-shaped oxide 156 is formed on the surface of the semiconductor layer 118. The line-shaped oxide 156 has one end located near the electrode 122.

A cap layer, i.e., a semiconductor layer 158 is formed on the semiconductor layer 118 with the electrode 122 and the line-shaped oxide 156 formed on.

An opening 160 is formed in the semiconductor layer 158 in the position above the electrode 122 and down to the electrode 122. In the opening 160, an electrode 123 is buried, electrically connected to the electrode 122.

A trench 162 is formed in the surface of the semiconductor layer 158 along the line-shaped oxide 156.

An interconnection 164 is formed in the trench 162, electrically connected to the electrode 123.

As described above, the quantum semiconductor device according to the present embodiment is characterized mainly in that the line-shaped oxide 156 is formed below the interconnection 164. Because of the line-shaped oxide 156, a barrier is formed against the carriers below the interconnection 164, and the leak current from the interconnection 164 can be suppressed.

Next, the method for fabricating the quantum semiconductor device according to the present embodiment will be explained with reference to FIG. 24.

Figure 10C:
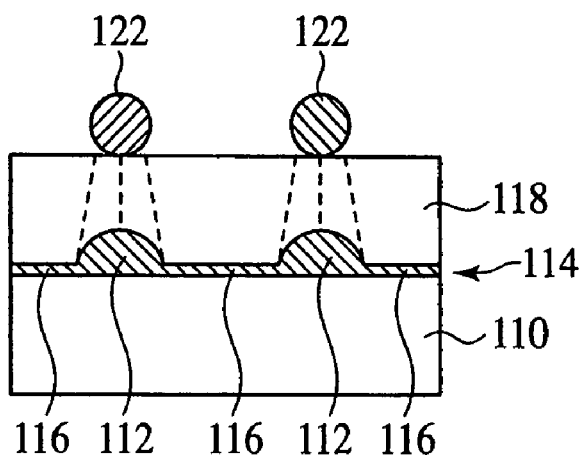

First, in the same way as in the second embodiment illustrated in FIGS. 10A to 10C, the electrode 122 is formed on the surface of the semiconductor layer 118 in the position above the quantum dot 112.

Figure 24A:
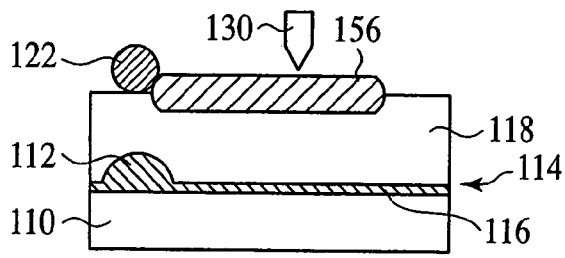
FIG. 24 is sectional views of the quantum semiconductor device according to the fifth embodiment of the present invention in the steps of the method for fabricating the quantum semiconductor device, which illustrate the method.
Figure 24B:
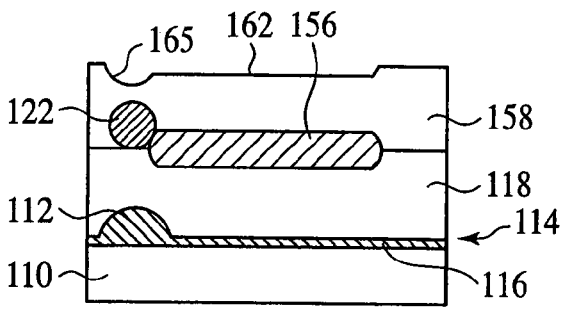
Figure 24C:
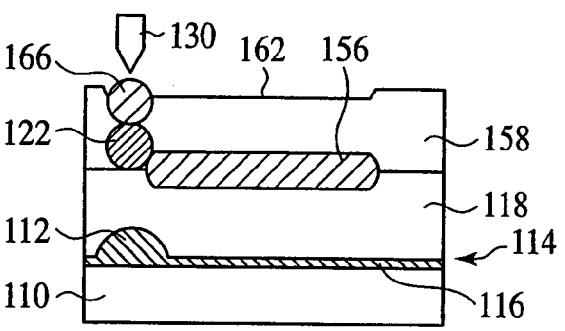
Figure 24D:
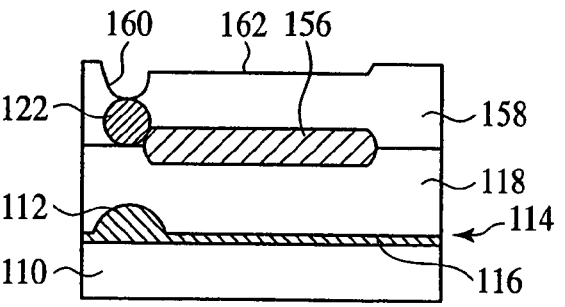
Figure 24E:
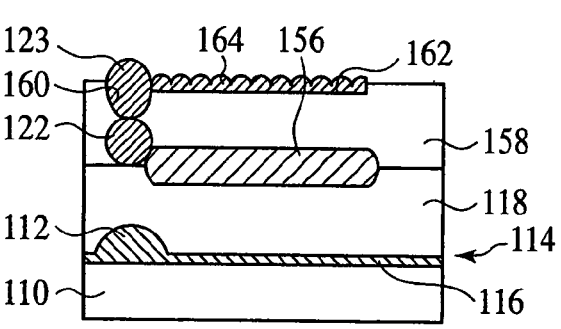

Next, the line-shaped oxide 156 is formed on the surface of the semiconductor layer 118 by AFM oxidation (see FIG. 24A). The line-shaped oxide 156 is formed with one end located near the electrode 122.

Next, the semiconductor layer 158 is formed by, e.g., MBE on the semiconductor layer 118 with the electrode 122 and the line-shaped oxide 156 formed on.

At this time, the semiconductor layer 158 grows on the electrode 122 and the line-shaped oxide 156 at a lower growth rate than in the rest region. Resultantly, the concavity 165 is formed in the surface of the semiconductor layer 158 in the position above the electrode 122, and the trench 162 is formed in the surface of the semiconductor layer 158 along the line-shaped oxide 156 (see FIG. 24B).

Next, the semiconductor layer 158 is oxidized by AFM oxidation in the position where the concavity 165 is formed. The dot-shaped oxide 166 is formed thus by oxidizing the part of the semiconductor layer 158, where the concavity 165 is formed (see FIG. 24C). The oxidation by AFM oxidation is set on until the size of the dot-shaped oxide 166 reaches the electrode 122 below the dot-shaped oxide 166.

Then, the dot-shaped oxide 166 formed in the concavity 165 is etched off. Thus, the opening 160 is formed in the semiconductor layer 158 down to the electrode 122 (see FIG. 24D).

Then, metal droplets are deposited by the droplet epitaxy method on the surface of the semiconductor layer 158 with the opening 160 and the trench 162 formed in. At this time, the metal droplets are formed in the opening 160, down to the electrode 122, and in the trench 162.

Then, the metal droplets are solidified by cooling after the deposition, and the metal particles are formed. Thus, the metal particle-shaped electrode 123 electrically connected to the electrode 122 and the interconnection 164 of the metal particles continuously connected in the trench 162 are formed (see FIG. 24E).

Thus, the quantum semiconductor device according to the present embodiment is formed.

Hereafter, as in the modification of the second embodiment, the electrode pad 132 electrically connected to the interconnection 164 may be formed.

As described above, according to the present embodiment, the interconnection 164 is formed in the trench 162 formed in the surface of the semiconductor layer 158 in the position above the line-shaped oxide 156, whereby the line-shaped oxide 156 can form the barriers to the carriers below the interconnection 164 and thus leak currents from the interconnection 164 can be suppressed.

In the present embodiment, the line-shaped oxide 156 is formed in 1 layer. However, the line-shaped oxide 156 may be formed in a plurality of layers by repeating the above described step. The line-shaped oxide 156 are formed in a plurality of layer below the interconnection 164, whereby the leak current from the interconnection 164 can be more effectively suppressed.

(Modification 1)

Figure 25:
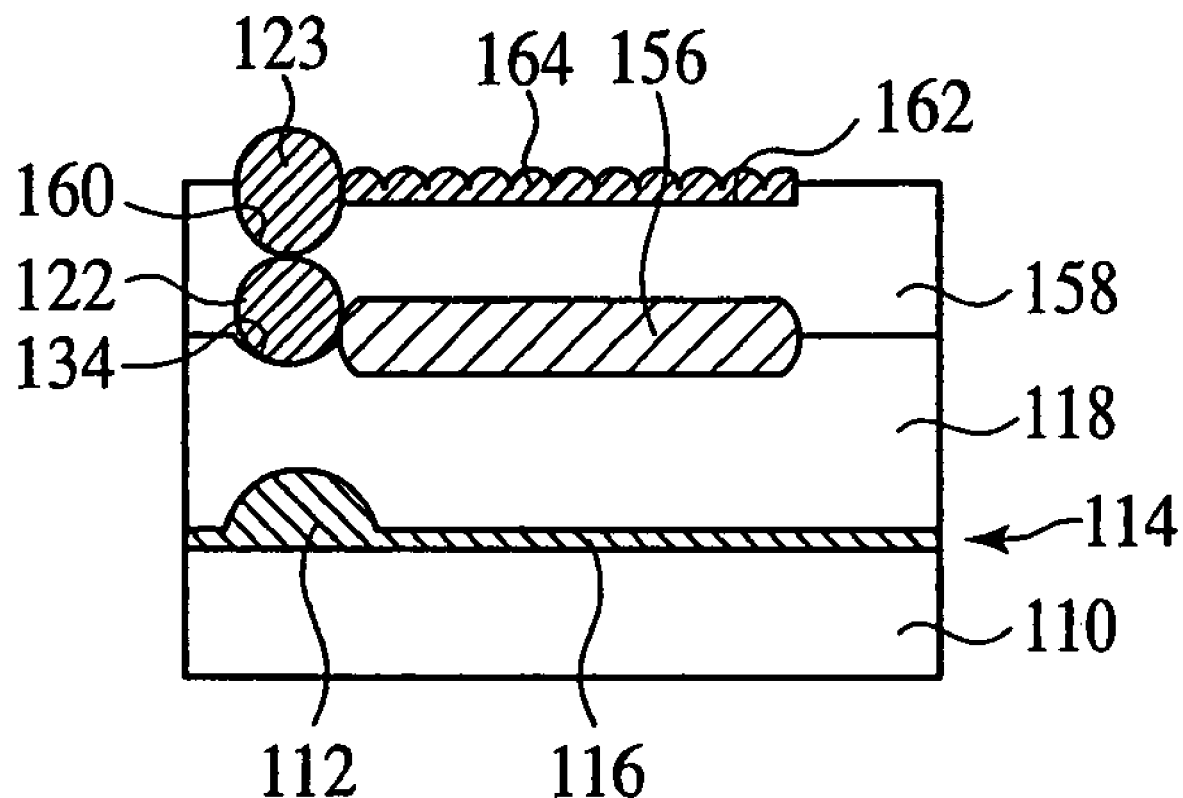
FIG. 25 is a sectional view of the quantum semiconductor device according to Modification 1 of the fifth embodiment of the present invention, which illustrates a structure thereof.

The quantum semiconductor device according to Modification 1 of the present embodiment and the method for fabricating the quantum semiconductor device will be explained with reference to FIGS. 25 and 26. FIG. 25 is a sectional view of the quantum semiconductor device according to the present modification, which illustrates a structure thereof. FIG. 26 is sectional views of the quantum semiconductor device according to the present modification in the steps of the method for fabricating the quantum semiconductor device, which illustrate the method.

First, the structure of the quantum semiconductor device according to the present modification will be explained with reference to FIG. 25.

In the quantum semiconductor device according to the present modification, the electrode 122 is formed above the quantum dot 112, as in the third embodiment. That is, as illustrated in FIG. 25, the electrode 122 is formed in the concavity 134 formed in the surface of the semiconductor layer 118 in the position above the quantum dot 112.

In the surface of the semiconductor layer 118, a line-shaped oxide 156 is formed with one end located near the electrode 122 formed in the concavity 134.

The semiconductor layer 158 is formed on the semiconductor layer 118 with the electrode 122 and the line-shaped oxide 156 formed on.

On the semiconductor layer 158, as described above, the electrode 123 electrically connected to the electrode 122 and the interconnection 164 electrically connected to the electrode 123 are formed.

Thus, the quantum semiconductor device according to the present modification is constituted.

Next, the method for fabricating the quantum semiconductor device according to the present modification will be explained with reference to FIG. 26.

First, as in the third embodiment, the electrode 122 is formed in the concavity 134 formed in the surface of the semiconductor layer 118 in the position above the quantum dot 112.

Figure 26A:
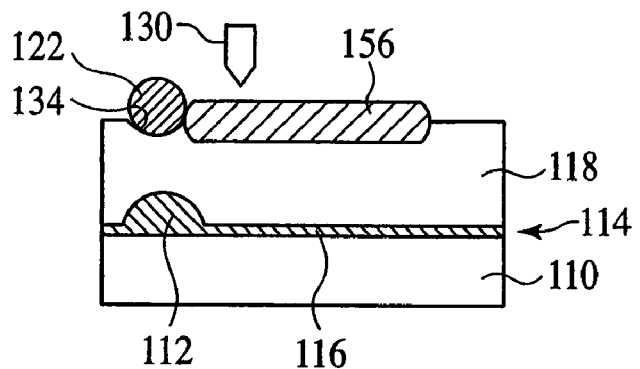
FIG. 26 is sectional views of the quantum semiconductor device according to Modification 1 of the fifth embodiment of the present invention in the steps of the method for fabricating the quantum semiconductor device, which illustrate the method.
Figure 26B:
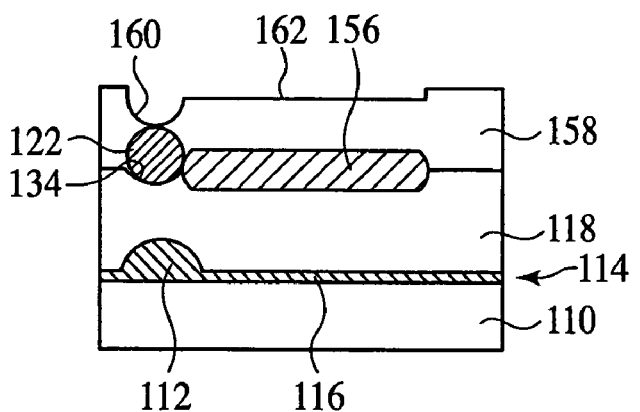

Next, the line-shaped oxide 156 is formed by AFM oxidation with one end located near the electrode 122 formed in the concavity 134 (see FIG. 26A).

Next, the semiconductor layer 158 is formed on the semiconductor layer 118 with the electrode 122 and the line-shaped oxide 156 formed on the surface. Then, the opening 160 is formed in the semiconductor layer 158 down to the electrode 122 (see FIG. 26B).

Figure 26C:
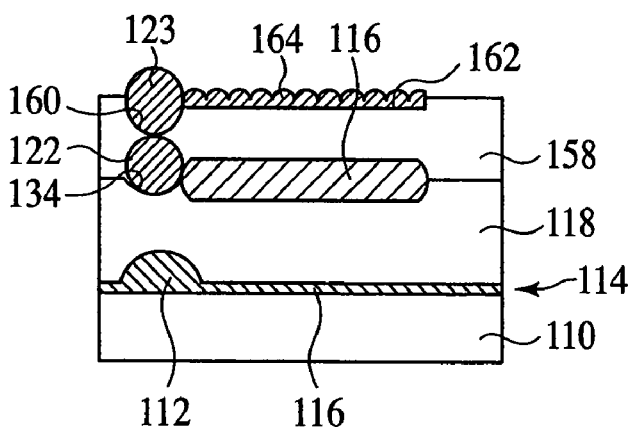

Next, by the droplet epitaxy method, the electrode 122 is formed in the opening 160 down to the electrode 122, and the interconnection 164 is formed in the trench 162 (see FIG. 26C).

Thus, the quantum semiconductor device according to the present modification is fabricated.

(Modification 2)

Figure 27:
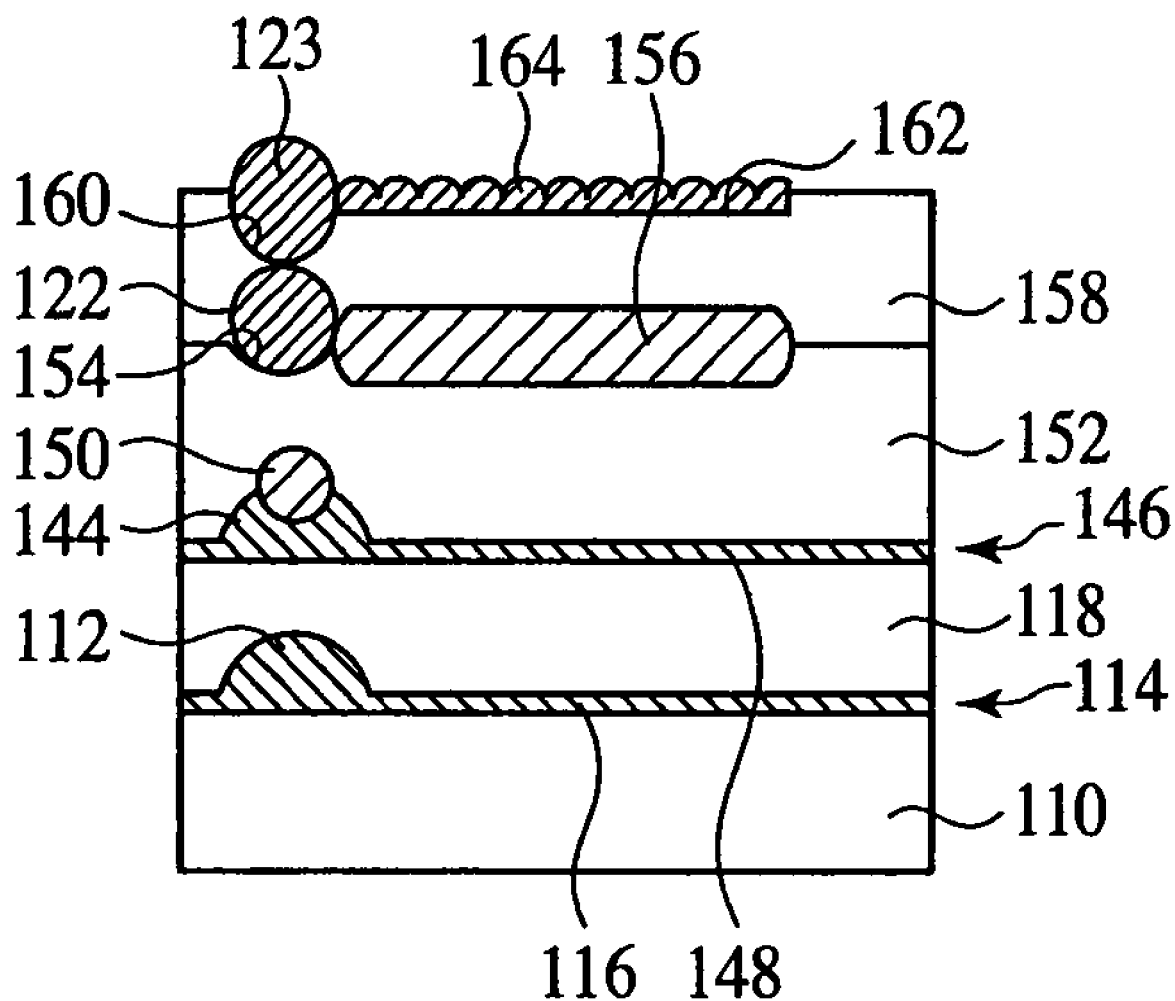
FIG. 27 is a sectional view of the quantum semiconductor device according to Modification 2 of the fifth embodiment of the present invention, which illustrates a structure thereof.

The quantum semiconductor device according to Modification 2 of the present embodiment and the method for fabricating the quantum semiconductor device will be explained with reference to FIGS. 27 and 28. FIG. 27 is a sectional view of the quantum semiconductor device according to the present modification, which illustrates the structure. FIG. 28 is sectional views of the quantum semiconductor device in the steps of the method for fabricating the quantum semiconductor device, which illustrate the method.

First, the structure of the quantum semiconductor device according to the present modification will be explained with reference to FIG. 27.

In the quantum semiconductor device according to the present modification, as in the fourth embodiment, the electrode 122 is formed above the quantum dot 112. That is, as illustrated in FIG. 27, the electrode 122 is formed in the surface of the semiconductor layer 152 in the position above the quantum dot 112 and the semiconductor dot 144.

In surface of the intermediate layer, i.e., the semiconductor layer 152, the line-shaped oxide 156 is formed with one end located near the electrode 122 formed in the concavity 154.

The cap layer, i.e., the semiconductor layer 158 is formed on the semiconductor layer 162 with the electrode 122 and the line-shaped oxide 156 formed on.

On the semiconductor layer 158, as described above, the electrode 123 electrically connected to the electrode 122 and the interconnection 164 electrically connected to the electrode 123 are formed.

Thus, the quantum semiconductor device according to the present modification is constituted.

Next, the method for fabricating the quantum semiconductor device according to the present modification will be explained with reference to FIG. 28.

First, in the same way as in the fourth embodiment, the electrode 122 is formed in the concavity 154 formed in the surface of the semiconductor layer 152 in the position above the quantum dot 112 and the semiconductor dot 144.

Figure 28A:
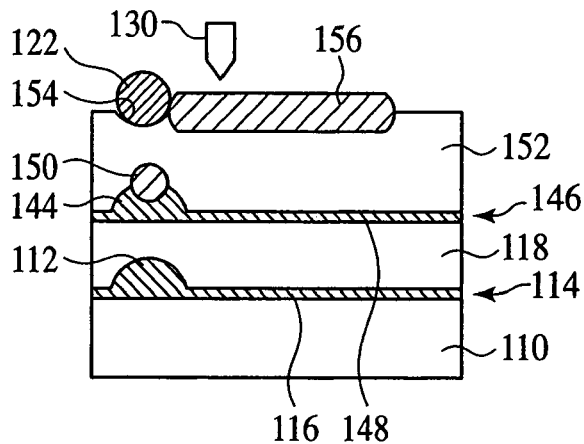
FIG. 28 is sectional views of the quantum semiconductor device according to Modification 2 of the fifth embodiment of the present invention in the steps of the method for fabricating the quantum semiconductor device, which illustrate the method.
Figure 28B:
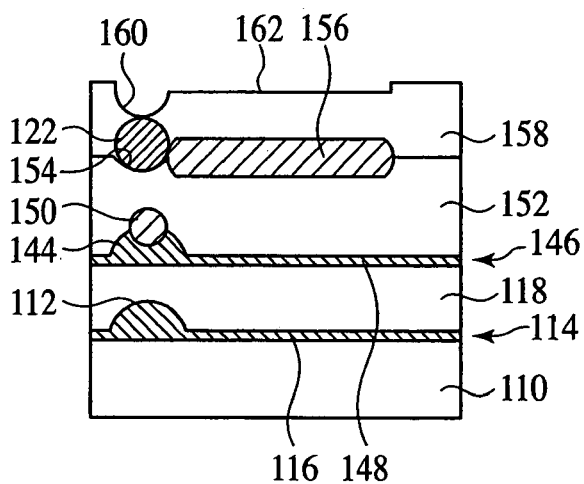

Next, the line-shaped oxide 156 is formed by AFM oxidation with one end located near the electrode 122 formed in the concavity 154 (see FIG. 28A).

Then, the semiconductor layer 158 is formed on the semiconductor layer 152 with the electrode 122 and the line-shaped oxide 156 formed on the surface. Then, the opening 160 is formed in the semiconductor layer 158 down to the electrode 122 (see FIG. 28B).

Figure 28C:
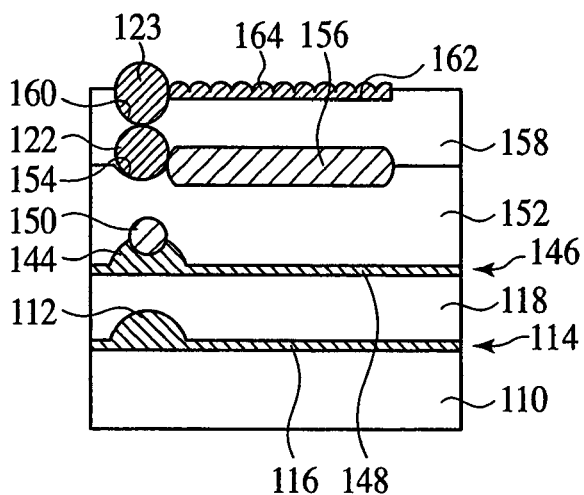

Next, by the droplet epitaxy method, the electrode 123 are formed in the opening 160 down to the electrode 122, and the interconnection 164 is formed in the trench 162 (see FIG. 28C).

Thus, the quantum semiconductor device according to the present modification is fabricated.

Modified Embodiments

The present invention is not limited to the above-described embodiments and can cover other various modification.

For example, in the first embodiment, AFM is used to form the oxide on the semiconductor substrate, but AFM is not essentially used. That is, any apparatus can be suitably used as long as the apparatus can apply a voltage between a probe-shaped conductor and the semiconductor substrate which are approached to each other to thereby form the oxide on the semiconductor substrate.

In the above-described embodiments, the semiconductor substrate is a GaAs substrate. However, the semiconductor substrate is not essentially a GaAs substrate and can be any other semiconductor substrate. On the semiconductor substrate with the concavity formed in, a semiconductor layer of a material whose lattice constant is lager than the material of the semiconductor substrate, whereby the quantum dot can be formed in the concavity.

For example, the semiconductor substrate may be a Si substrate. When a Si substrate is used, the oxide of $SiO_2$ is formed. In this case, diluted hydrofluoric acid, for example, is used as the etchant, whereby the oxide of $SiO_2$ can be selectively etched off without etching the Si substrate. A semiconductor layer of a material whose lattice constant is larger than that of Si, is grown on an Si substrate with the concavity formed in, whereby the quantum dot can be formed in the concavity. The material of the semiconductor layer can be, e.g., Ge.

The semiconductor substrate may be an AlGaAs substrate. A semiconductor layer of a material whose lattice constant is larger than that of AlGaAs, is grown on an AlGaAs substrate with the concavity formed in, whereby the quantum dot can be formed in the concavity. The material of the semiconductor layer can be, e.g., InAlGaAs.

The semiconductor substrate may be a ZnSe substrate. A semiconductor layer of a material whose lattice constant is larger than that of ZnSe, is grown on a ZnSe substrate with the concavity formed in, whereby the quantum dot can be formed in the concavity. The material of the semiconductor layer can be, e.g., CdSe.

In the second to the fifth embodiments, the electrodes are formed with respect to the quantum dots self-assembled by S-K mode. However, the quantum dots with respect to which the electrodes are formed are not essentially self-assembled by S-K mode. For example, the present invention is applicable to the case that the electrodes are formed with respect to the quantum dots vertically laid one above another.

In the second to the fifth embodiments, the quantum dots are oxidized or the semiconductor layer is oxidized to form the line-shaped oxides, by AFM oxidation. The probe for applying a voltage can be any as long as the probe is formed of a conductor. For example, as the probe, a carbon nanotube can be also used.

In the second to the fifth embodiments, the quantum dots or the semiconductor layer is oxidized by AFM oxidation. However, the quantum dots, etc. are not essentially oxidized by AFM oxidation. The quantum dots, etc. can be oxidized by any means as long as the means can oxidize selectively a fine area.

INDUSTRIAL APPLICABILITY

The method for forming a quantum dot according to the present invention is useful to form quantum dots usable in the fields of quantum information and quantum computation, and other fields. The quantum semiconductor device according to the present invention and the method for fabricating the quantum semiconductor device are useful to realize accurate electric access to quantum dots, which is very important in various aspects of fundamental studies of the quantum dot and their application developments, etc.

The invention claimed is:

1. A quantum semiconductor device comprising:
a plurality of quantum dots formed over a semiconductor substrate;
a semiconductor layer formed, burying said plurality of quantum dots;
a plurality of metal electrodes formed by self-alignment above positions where strains are generated in the semiconductor layer because of said plurality of quantum dots, said plurality of metal electrodes being formed above each of said plurality of quantum dots; and
a plurality of interconnections formed in a plurality of trenches formed in a surface of the semiconductor layer, each of said plurality of interconnections being electrically connected to each of said plurality of metal electrodes.

2. A quantum semiconductor device according to claim 1, wherein
the semiconductor layer is formed of a material whose lattice constant is different from that of said quantum dots.

3. A quantum semiconductor device comprising:
a plurality of quantum dots formed over a semiconductor substrate;
a semiconductor layer formed, burying said a plurality of quantum dots; and
a plurality of metal electrodes formed in each of concavities formed in a surface of the semiconductor layer in each of positions above each of said a plurality of quantum dots.

4. A quantum semiconductor device comprising:
a plurality of quantum dots formed over a semiconductor substrate;
a semiconductor layer formed, burying said plurality of quantum dots;
a plurality of metal electrodes formed by self-alignment above positions where strains are generated in the semiconductor layer because of said plurality of quantum dots, said plurality of metal electrodes being formed above each of said plurality of quantum dots;
a plurality of line-shaped oxides formed on the surface of the semiconductor layer, each of said plurality of line-shaped oxides having one end located near each of said plurality of metal electrodes;
a second semiconductor layer formed, burying said plurality of metal electrodes and said plurality of line-shaped oxides;
a plurality of second metal electrodes buried in said second semiconductor layer, each of said plurality of second metal electrodes being electrically connected to each of said plurality of metal electrodes; and
a plurality of interconnections formed in a plurality of trenches formed in a surface of said second semiconductor layer along each of said plurality of line-shaped oxides, each of said plurality of interconnections being electrically connected to each of said plurality of second metal electrodes.

5. A quantum semiconductor device comprising:
a quantum dot formed over a semiconductor substrate;
a first semiconductor layer formed, burying the quantum dot;
a semiconductor dot formed on the first semiconductor layer in a position above the quantum dot;
a dot-shaped oxide formed of the partially oxidized semiconductor dot;
a second semiconductor layer formed, burying the semiconductor dot; and
an electrode formed in a concavity formed in a surface of the second semiconductor layer in a position above the dot-shaped oxide.

6. A quantum semiconductor device according to claim 5, wherein
the semiconductor dot is a quantum dot or an anti-dot.

7. A quantum semiconductor device according to claim 5, further comprising
an interconnection formed in a trench formed in the surface of the second semiconductor layer and electrically connected to said electrode.

8. A quantum semiconductor device according to claim 5, further comprising:
a line-shaped oxide formed on the surface of the second semiconductor layer and having one end located near said electrode;
a third semiconductor layer formed, burying said electrode and the line-shaped oxide;
another electrode buried in the third semiconductor layer and electrically connected to said electrode; and
an interconnection formed in a trench formed in a surface of the third semiconductor layer along the line-shaped oxide and electrically connected to said another electrode.

9. A quantum semiconductor device according to claim 3, wherein
said quantum dots are each formed in a three-dimensionally grown island self-assembled by S-K mode.

10. A quantum semiconductor device according to claim 3, further comprising
an interconnection formed in a trench formed in the surface of the semiconductor layer and electrically connected to said metal electrode.

11. A quantum semiconductor device according to claim 3, further comprising:
a plurality of line-shaped oxides formed on the surface of the semiconductor layer, each of said plurality of line-shaped oxides having one end located near each of said plurality of metal electrodes;
a second semiconductor layer formed, burying said plurality of metal electrodes and said plurality of line-shaped oxides;
a plurality of second metal electrodes buried in said second semiconductor layer, each of said plurality of second metal electrodes being electrically connected to each of said plurality of metal electrodes; and
a plurality of interconnections formed in a plurality of trenches formed in a surface of said second semiconductor layer along each of said plurality of line-shaped oxides, each of said plurality of interconnections being electrically connected to each of said plurality of second metal electrodes.

12. A quantum semiconductor device according to claim 6, further comprising
   an interconnection formed in a trench formed in the surface of the second semiconductor layer and electrically connected to said electrode.

13. A quantum semiconductor device according to claim 6, further comprising:
   a line-shaped oxide formed on the surface of the second semiconductor layer and having one end located near said electrode;
   a third semiconductor layer formed, burying said electrode and the line-shaped oxide;
   another electrode buried in the third semiconductor layer and electrically connected to said electrode; and
   an interconnection formed in a trench formed in a surface of the third semiconductor layer along the line-shaped oxide and electrically connected to said another electrode.

14. A quantum semiconductor device according to claim 5, wherein
   the quantum dot is formed in a three-dimensionally grown island self-assembled by S-K mode.

15. A quantum semiconductor device according to claim 6, wherein
   the quantum dot is formed in a three-dimensionally grown island self-assembled by S-K mode.

* * * * *